US011041229B2

(12) United States Patent
Masuda et al.

(10) Patent No.: US 11,041,229 B2
(45) Date of Patent: Jun. 22, 2021

(54) SILVER-COATED ALLOY POWDER, ELECTRICALLY CONDUCTIVE PASTE, ELECTRONIC PART, AND ELECTRIC DEVICE

(71) Applicant: DOWA ELECTRONICS MATERIALS CO., LTD., Tokyo (JP)

(72) Inventors: Kyoso Masuda, Tokyo (JP); Kenichi Inoue, Tokyo (JP); Yuki Kaneshiro, Tokyo (JP); Atsushi Ebara, Tokyo (JP); Yoshiyuki Michiaki, Tokyo (JP); Kozo Ogi, Tokyo (JP); Takahiro Yamada, Tokyo (JP); Masahiro Yoshida, Tokyo (JP)

(73) Assignee: DOWA ELECTRONICS MATERIALS CO., LTD., Tokyo (JP)

( * ) Notice: Subject to any disclaimer, the term of this patent is extended or adjusted under 35 U.S.C. 154(b) by 161 days.

(21) Appl. No.: 16/329,069

(22) PCT Filed: Aug. 31, 2017

(86) PCT No.: PCT/JP2017/031470
§ 371 (c)(1),
(2) Date: Feb. 27, 2019

(87) PCT Pub. No.: WO2018/043681
PCT Pub. Date: Mar. 8, 2018

(65) Prior Publication Data
US 2019/0194778 A1    Jun. 27, 2019

(30) Foreign Application Priority Data

Aug. 31, 2016   (JP) .............................. JP2016-169436

(51) Int. Cl.
*B32B 5/16*     (2006.01)
*C22C 9/06*     (2006.01)
(Continued)

(52) U.S. Cl.
CPC .................. *C22C 9/06* (2013.01); *B22F 1/00* (2013.01); *B22F 1/0011* (2013.01); *B22F 1/02* (2013.01);
(Continued)

(58) Field of Classification Search
CPC .. C08K 9/04; H05K 1/095; C22C 9/00; C22C 9/04; C22C 9/06
See application file for complete search history.

(56) References Cited

U.S. PATENT DOCUMENTS 9,190,202 B2    11/2015   Ishii et al.
2006/0145125 A1   7/2006   Kuwajima et al.
(Continued)

FOREIGN PATENT DOCUMENTS

JP    2005-019310    1/2005
JP    2014-084267    5/2014
(Continued)

OTHER PUBLICATIONS

Translation JP 2015021143A (Year: 2015).*
Translation WO 2015-008628 (Year: 2015).*
Translation JP 2005019310A (Year: 2005).*
Extended European Search Report (EESR) for European Patent Application No. 17846684.3, dated Jan. 22, 2020.
International Search Report issued in International Pat. Appl. No. PCT/JP2017/031470, dated Nov. 7, 2017.
(Continued)

*Primary Examiner* — Hoa (Holly) Le
(74) *Attorney, Agent, or Firm* — Greenblum & Bernstein P.L.C.

(57) ABSTRACT

An object of the present invention is to provide metal powder that can be used to form an external electrode, which is excellent in solder wettability and solder leach resistance while having a layer structure with fewer layers than in the related art and, furthermore, is excellent in electrical conductivity. This silver-coated alloy powder comprises a coating layer on a surface of an alloy core particle containing copper, nickel, zinc, and inevitable impurities, the coating layer containing silver.

19 Claims, 6 Drawing Sheets

(a)

(b)

(c)

(51) Int. Cl.
*B22F 1/00* (2006.01)
*H01G 4/232* (2006.01)
*H01B 5/00* (2006.01)
*H01B 1/00* (2006.01)
*C22C 9/00* (2006.01)
*H01G 4/30* (2006.01)
*C22C 9/04* (2006.01)
*B22F 1/02* (2006.01)
*H01B 1/22* (2006.01)
*H01G 4/228* (2006.01)
*H05K 1/09* (2006.01)

(52) U.S. Cl.
CPC ............... *B22F 1/025* (2013.01); *C22C 9/00* (2013.01); *C22C 9/04* (2013.01); *H01B 1/00* (2013.01); *H01B 1/22* (2013.01); *H01B 5/00* (2013.01); *H01G 4/228* (2013.01); *H01G 4/232* (2013.01); *H01G 4/30* (2013.01); *H05K 1/097* (2013.01); *B22F 2301/255* (2013.01); *B22F 2304/10* (2013.01)

(56) References Cited

U.S. PATENT DOCUMENTS

2014/0346413 A1 11/2014 Inoue et al.
2017/0037271 A1* 2/2017 Kobayashi ........... C09D 11/106

FOREIGN PATENT DOCUMENTS

| JP | 2014-107513 | 6/2014 |
| JP | 2015-021143 | 2/2015 |
| JP | 2015-204453 | 11/2015 |
| WO | 2004/068506 | 8/2004 |
| WO | 2013/108916 | 7/2013 |
| WO | 2015/008628 A1 | 1/2015 |

OTHER PUBLICATIONS

International Preliminary Report on Patentability issued with respect to Pat. Appl. No. PCT/JP2017/031470, dated Mar. 5, 2019.

* cited by examiner

SILVER-COATED ALLOY POWDER, ELECTRICALLY CONDUCTIVE PASTE, ELECTRONIC PART, AND ELECTRIC DEVICE

TECHNICAL FIELD

The present invention relates to silver-coated alloy powder suitable as a material for forming an external electrode of an electronic part, an electrically conductive paste including the same, an electronic part having an external electrode formed using the electrically conductive paste, and an electric device including the electronic part.

BACKGROUND ART

As electronic parts constituting an electronic device, there are electronic parts that include an external electrode, such as capacitors, inductors, piezoelectric elements, varistors, and thermistors. Capacitors and inductors thereamong are constructed so as to include, for example, a stack in which a dielectric layer and an internal electrode layer are alternately stacked and an external electrode formed on a side surface of the stack and connected to an internal electrode.

The electronic part is mounted on a substrate and is connected with other electric elements. A representative connection method is solder joint. For example, a solder paste is printed so that (the external electrode of) the electronic part and the electric element are connected, and reflow is performed at a temperature of about 200° C. to 350° C. for the connection.

For solder joint to be appropriately carried out, first, it is necessary that the molten solder be sufficiently wetted on the external electrode so that the solder and the external electrode are joined sufficiently (solder wettability). Second, it is required that solder leach does not occur, which is presumed to be caused by the external electrode dissolving into the molten solder (solder leach resistance).

The external electrode is formed from a calcinated-type electrically conductive paste containing an electrically conductive filler formed from copper or the like, and in order to perform preferable solder joint and to improve reliability, an external electrode is generally formed by performing Ni plating and Sn plating on an electrically conductive film formed from the paste (for example, Patent Documents 1 to 3).

PRIOR ART DOCUMENT

Patent Documents

[Patent Document 1] Japanese Patent Application Publication No. 2014-84267
[Patent Document 2] Japanese Patent Application Publication No. 2015-204453
[Patent Document 3] Japanese Patent Application Publication No. 2014-107513

SUMMARY OF THE INVENTION

Problem to be Solved by the Invention

However, in such a three-layer structure having an electrically conductive film, a Ni plating layer, and a Sn plating layer, there is room for improvement from the viewpoint of cost and production efficiency, and for adjacent layers (a stack of a dielectric layer and an internal electrode layer, and an electrically conductive film, an electrically conductive film and a Ni plating layer, and a Ni plating layer and a Sn plating layer) it is necessary to consider the adhesion and contact resistance between these layers, so it is desirable to form the external electrode so as to have a layer structure with fewer layers than such a three-layer structure. Moreover, it is desirable to reduce the film thickness of the external electrode, in view of recent trend of downsizing of electronic devices, so from this point of view as well, such a layer structure is desirable. Furthermore, in the application for capacitors, electrical conductivity is also important.

In view of the above, it is an object of the present invention to provide metal powder that can be used to form an external electrode, which is excellent in solder wettability and solder leach resistance while having a layer structure with fewer layers and, furthermore, excellent in electrical conductivity.

Also, for preferable solder joint to be performed, it is desirable that the aforementioned external electrode has excellent bonding strength with respect to solder (the aforementioned solder wettability is one of factors having an influence on the bonding strength). Desirably, in addition to achieving the above object, the present invention has yet another object to further provide metal powder that can be used to form an external electrode which is particularly excellent in bonding strength with respect to solder.

Means of Solving the Problem

The inventors of the present invention conducted intensive studies to solve the above problems. Metal powder is used as an electrically conductive filler in electrically conductive pastes for forming an external electrode. For such metal powder, powder composed of a single metal such as copper powder, an alloy powder, coated metal powder obtained by coating a core made of a single metal or alloy with a predetermined metal, and so on are being currently proposed.

In the formation of an external electrode, in the case of a calcinated-type electrically conductive paste, when it is welded to form an electrically conductive film, the electrically conductive filler melts, but in the case of a resin-cured-type electrically conductive paste, electrical conduction is achieved by bringing the electrically conductive filler into contact through the curing shrinkage of a resin, and therefore, it is presumed that in the formed electrically conductive film, the electrically conductive filler is present in the original shape and constitution. The inventors of the present invention focused on this characteristic of resin-cured-type electrically conductive pastes.

The inventors of the present invention first adopted silver, which excels in conductivity above all, for the electrically conductive filler and conducted a study, and found out that the silver is excellent in electrical conductivity and also excellent in solder wettability, but very poor in solder leach resistance.

It is presumed that the phenomenon of solder leach is caused by solder contacting the surface of an external electrode and the electrode dissolving into the solder from this contact surface. Based on this, the inventors of the present invention arrived at the idea of using a metal having excellent solder leach resistance for the core particle and coating it with silver so that while excellent electrical conductivity and solder wettability is maintained, regarding solder leach, although the silver coating (of the metal powder on the external electrode surface) is corroded, solder leach is inhibited at the core particle part.

When nickel excelling in solder leach resistance was adopted for the core particle and silver-coated nickel powder was used for a conductive filler, the solder wettability significantly deteriorated and the electrical conductivity also deteriorated significantly.

Then, in order to increase electrical conductivity, copper which is inexpensive and excellent in electrical conductivity was introduced into the core particle to change the above to a copper-nickel alloy; accordingly, electrical conductivity increased and, unexpectedly, solder wettability also increased. However, there was still room for improvement.

Here, regarding coated metal powder obtained by coating a metal core particle with metal, it is known that there are cases where a core particle cannot be coated entirely due to influences such as compatibility between the metal core particle and the coating metal and coating reaction conditions. Based on this knowledge, it is inferred that the reason why solder wettability improved by using the copper-nickel alloy described above was because copper-nickel alloy is more preferable than nickel in terms of being coated with silver (the proportion of the covered area of the metal core particle is increased), and as a result, the proportion of the presence of silver excelling in solder wettability increased on the surface of the electrically conductive film.

In view of the above, studies were conducted so as to perform even more preferable silver coating, and a copper-nickel-zinc alloy was used for a core particle, which resulted in an improvement in solder wettability while the above-mentioned preferable electrical conductivity was maintained, and unexpectedly, solder leach resistance also improved in some cases. Further, it was found that by subjecting such silver-coated alloy powder to surface treatment using a predetermined method and to a crushing process under a predetermined condition, the obtained external electrode was particularly excellent in bonding strength with respect to solder.

That is, the present invention relates to silver-coated alloy powder comprising a coating layer on a surface of an alloy core particle containing copper, nickel, zinc, and inevitable impurities, the coating layer containing silver.

A volume-based cumulative 50% particle diameter ($D_{50}$) of the silver-coated alloy powder as measured by a laser diffraction particle size distribution measurement apparatus is preferably 0.1 to 10 μm, a specific surface area of the silver-coated alloy powder as measured by a single point BET method is preferably 0.08 to 1.0 m$^2$/g, and a TAP density of the silver-coated alloy powder is preferably 3.0 to 7.5 g/cm$^3$.

Preferably, in a total 100 mass % of copper, nickel, and zinc in the alloy core particle, a proportion of copper is 40 to 95 mass %, a proportion of nickel is 4 to 40 mass %, and a proportion of zinc is 1 to 30 mass %.

A mass percentage of silver in the silver-coated alloy powder is preferably 1 to 40 mass % and oxygen content in the silver-coated alloy powder is preferably 0.05 to 0.45 mass %. A proportion of the oxygen content in the silver-coated alloy powder based on the specific surface area (O/BET) is preferably 0.15 to 4.0 mass %·g/m$^2$, more preferably 0.25 to 3.0 mass %·g/m$^2$.

A value obtained by dividing a ratio of the TAP density to a true density of the silver-coated alloy powder by ($D_{50}$) (TAP density/(true density×$D_{50}$)) is preferably 0.223 or more, more preferably 0.225 to 0.300.

When energy-dispersive X-ray spectroscopy (EDS) is performed on any 20 particles constituting the silver-coated alloy powder for C element and Ag element, given that for each of EDS spectra obtained for the 20 particles for the C element and the Ag element, an integrated value of the spectrum of the C element is $I_c$ and an integrated value of the spectrum of the Ag element is $I_{Ag}$, a standard deviation of a ratio of $I_c$ to $I_{Ag}$ ($I_c/I_{Ag}$) is preferably in a range of 0.010 to 0.040.

It is preferable that the silver-coated alloy powder according to the present invention be subjected to surface treatment so that a TAP density is increased by improving dispersibility in an electrically conductive paste (described later) so as to increase the electrical conductivity of the external electrode while also imparting oxidation resistance, and thus decrease change over time of electrical conductivity, such that the powder has a surface treatment layer constituted by a surface treatment agent. Examples of the surface treatment agent include a saturated or unsaturated fatty acid having 1 to 32 carbon atoms, a saturated or unsaturated amine having 1 to 32 carbon atoms, and a heterocyclic compound having 5 to 12 ring-constituting atoms. The fatty acid and the amine may have a cyclic structure, and the heterocyclic compound may be saturated or unsaturated, and may be a compound having a condensed ring structure. From the viewpoint of electrical conductivity, a saturated or unsaturated fatty acid having 1 to 32 carbon atoms is preferable as the surface treatment agent. From the viewpoint of dispersibility, the carbon number of the fatty acid and amine described above is preferably 4 to 24. For the heterocyclic compound, a triazole compound (a compound having a triazole structure in the molecule) is preferable.

With the use of an electrically conductive paste containing curable resin and the silver-coated alloy powder according to the present invention, it is possible to form an external electrode excellent in solder wettability, solder leach resistance, and electrical conductivity, using a layer structure with fewer layers than in the related art.

Examples of the curable resin in the electrically conductive paste include thermal curable resin and photocurable resin, and the percentage of the resin included in the electrically conductive paste is preferably 1 to 40 mass %.

Preferably, the curable resin is at least one type selected from the group consisting of phenolic resins, urea resins, melamine resins, epoxy resins, unsaturated polyester resins, silicone resins, polyurethane resins, polyvinyl butyral resins, polyimide resins, polyamide resins, maleimide resins, diallyl phthalate resins, oxetane resins, (meth)acrylic resins, maleic acid resins, maleic anhydride resins, polybutadiene resins, alkyd resins, amino resins, polylactic acid resins, oxazoline resins, benzoxazine resins, and fluororesins.

Content of the silver-coated alloy powder in the electrically conductive paste is preferably 50 to 98 mass %.

In an electronic part including an external electrode formed using such an electrically conductive paste, the external electrode includes curable resin and the silver-coated alloy powder according to the present invention.

In a total of the silver-coated alloy powder and the curable resin in the external electrode, a proportion of the silver-coated alloy powder is preferably 60 to 99 mass % and a proportion of the curable resin is preferably 1 to 40 mass %.

Examples of the electronic part include a capacitor, an inductor, a laminated wiring board, a piezoelectric element, a varistor, a thermistor, and a resistor.

An electric device including such an electronic part has a constitution including a substrate, an electric element formed on the substrate, an electronic part mounted on the substrate, and a solder member connecting the electronic part and the electric element.

This electric device is preferably such that an external electrode of the electronic part and the solder member adhere to each other, and bonding strength thereof is $3.0 \times 10^4$ Pa to $20.0 \times 10^4$ Pa.

Examples of the substrate include a paper phenol substrate, a paper epoxy substrate, a glass epoxy substrate, a polymer film, a glass substrate, or a ceramic substrate, and it is preferable that the solder member contain at least one metal selected from the group consisting of tin, lead, silver, copper, zinc, bismuth, indium, and aluminum.

Another aspect of the present invention relates to a method of producing silver-coated alloy powder, the method comprising:

a silver coating step of forming a coating layer on a surface of an alloy core particle containing copper, nickel, zinc, and inevitable impurities, the coating layer containing silver;

a surface treatment step of processing the silver-coated alloy powder obtained in the silver coating step with a surface treatment agent in a wet method; and a crushing step of subjecting the surface-treated silver-coated alloy powder to strong crushing.

Preferably, in the crushing step, the surface-treated silver-coated alloy powder is subjected to crushing at a peripheral speed of 30 m/s or more, and a product of the peripheral speed (m/s) and a crushing time (second) is 2000 m or more.

Effect of Invention

According to the present invention, metal powder (silver-coated alloy powder) is provided that can be used to form an external electrode, which is excellent in solder wettability and solder leach resistance while having a layer structure with fewer layers than in the related art and, furthermore, is excellent in electrical conductivity. Further, there are also provided an electrically conductive paste, an electronic part, and an electric device in which the silver-coated alloy powder is used.

BEST MODES FOR CARRYING OUT THE INVENTION

Figure 1:
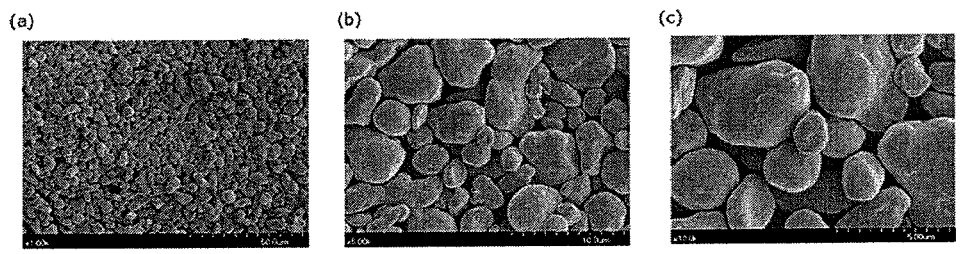
FIG. 1 shows a SEM observation image of silver-coated alloy powder obtained in Production Example 1 ((a) shows magnification of 1000 times, (b) 5000 times, and (c) 10000 times).
Figure 2:
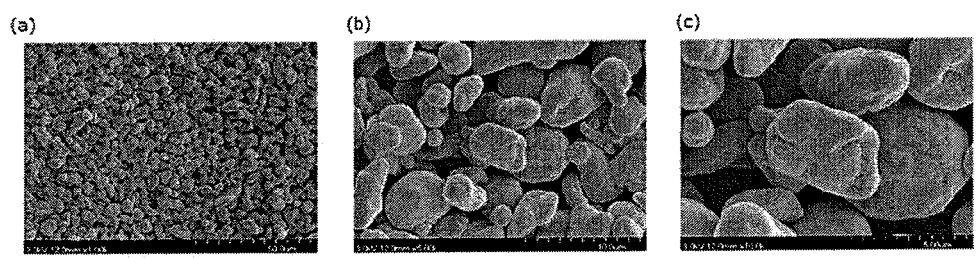
FIG. 2 shows a SEM observation image of silver-coated alloy powder obtained in Production Example 2 ((a) shows magnification of 1000 times, (b) 5000 times, and (c) 10000 times).
Figure 3:
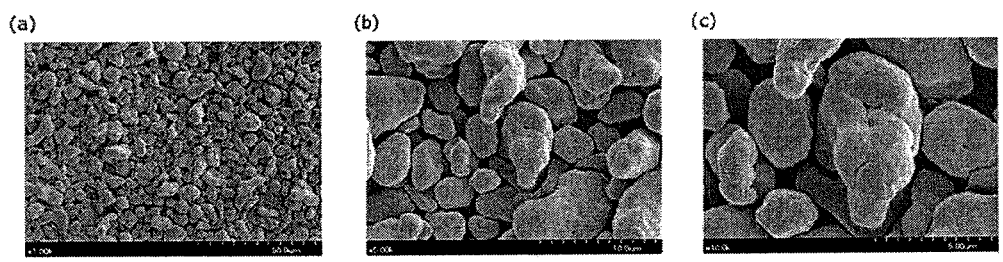
FIG. 3 shows a SEM observation image of silver-coated alloy powder obtained in Production Example 3 ((a) shows magnification of 1000 times, (b) 5000 times, and (c) 10000 times).
Figure 4:
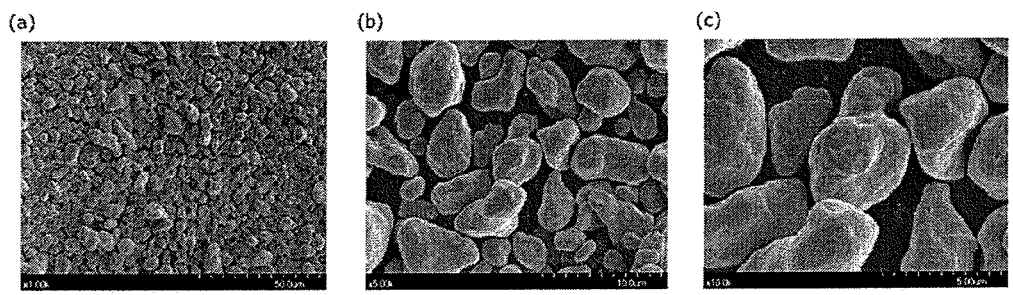
FIG. 4 shows a SEM observation image of silver-coated alloy powder obtained in Production Example 4 ((a) shows magnification of 1000 times, (b) 5000 times, and (c) 10000 times).
Figure 5:
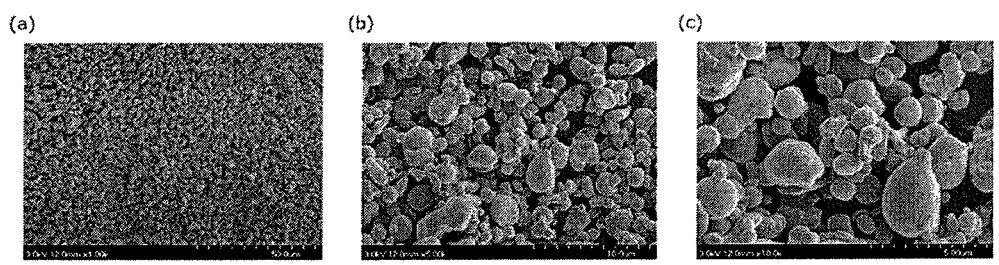
FIG. 5 shows a SEM observation image of silver-coated alloy powder obtained in Production Example 5 ((a) shows magnification of 1000 times, (b) 5000 times, and (c) 10000 times).
Figure 6:
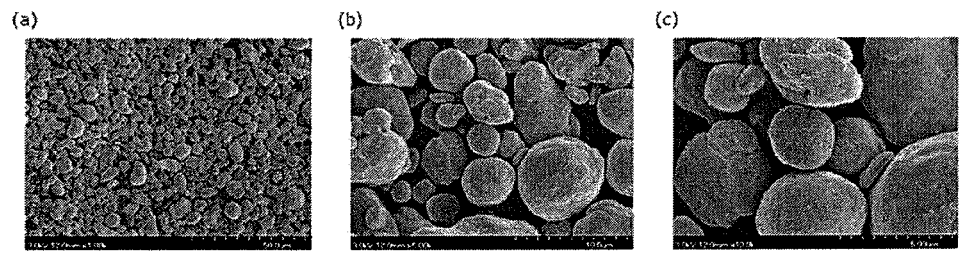
FIG. 6 shows a SEM observation image of silver-coated alloy powder obtained in Production Example 6 ((a) shows magnification of 1000 times, (b) 5000 times, and (c) 10000 times).
Figure 7:
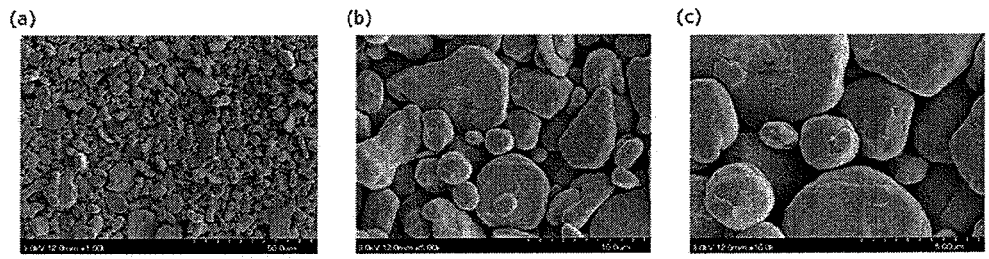
FIG. 7 shows a SEM observation image of silver-coated alloy powder obtained in Production Example 7 ((a) shows magnification of 1000 times, (b) 5000 times, and (c) 10000 times).
Figure 8:
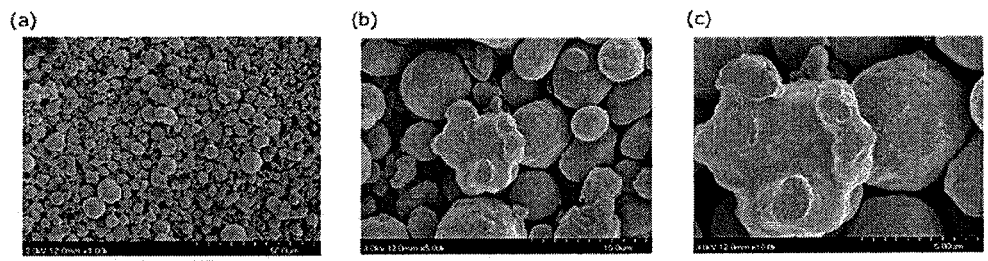
FIG. 8 shows a SEM observation image of silver powder obtained in Comparative Production Example 1 ((a) shows magnification of 1000 times, (b) 5000 times, and (c) 10000 times).
Figure 9:
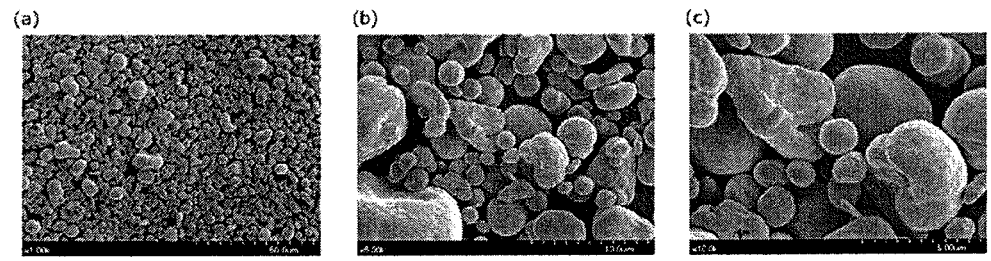
FIG. 9 shows a SEM observation image of silver-coated copper powder obtained in Comparative Production Example 2 ((a) shows magnification of 1000 times, (b) 5000 times, and (c) 10000 times).
Figure 10:
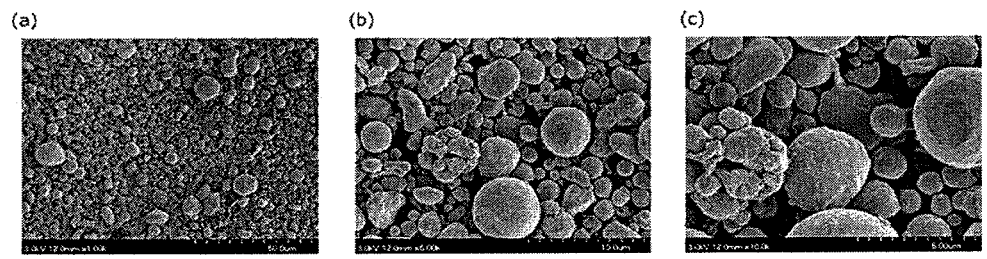
FIG. 10 shows a SEM observation image of silver-coated nickel powder obtained in Comparative Production Example 3 ((a) shows magnification of 1000 times, (b) 5000 times, and (c) 10000 times).
Figure 11:
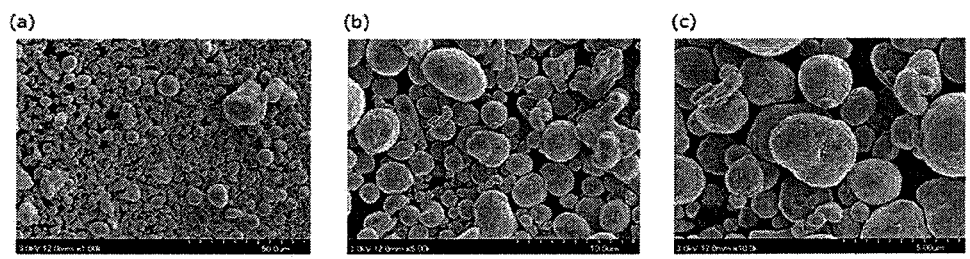
FIG. 11 shows a SEM observation image of silver-coated Cu—Ni powder obtained in Comparative Production Example 4 ((a) shows magnification of 1000 times, (b) 5000 times, and (c) 10000 times).
Figure 12:
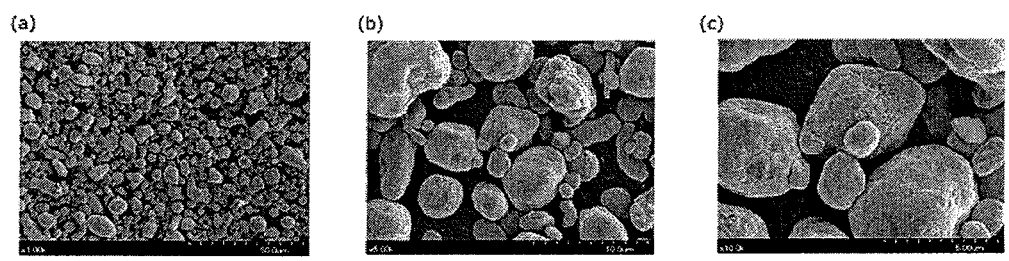
FIG. 12 shows a SEM observation image of silver-coated Cu—Ni powder obtained in Comparative Production Example 5 ((a) shows magnification 1000 times, (b) 5000 times, and (c) 10000 times).
Figure 13:
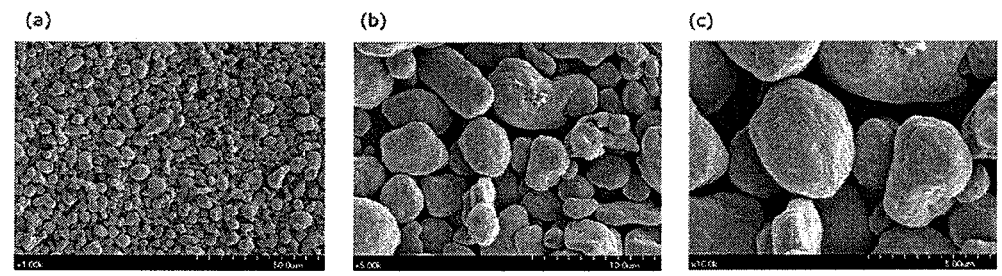
FIG. 13 shows a SEM observation image of silver-coated Cu—Ni powder obtained in Comparative Production Example 6 ((a) shows magnification 1000 times, (b) 5000 times, and (c) 10000 times).

Hereinbelow, the present invention will be described in detail.

[Silver-Coated Alloy Powder]
<Constitution of Silver-Coated Alloy Powder>

Silver-coated alloy powder according to the present invention includes a coating layer on a surface of an alloy core particle containing copper, nickel, zinc, and inevitable impurities, the coating layer containing silver (silver or silver compound). A coating layer containing silver (hereinafter referred to as a "silver coating layer") contributes to the excellent electrical conductivity and solder wettability of (an external electrode formed from an electrically conductive paste containing) silver-coated alloy powder. Since the alloy core particle contains copper, the particle has poor oxidation resistance, and the silver coating layer contributes to an increase in the oxidation resistance of the alloy core particle. The silver coating layer preferably consists substantially of silver alone. The silver coating layer coats the alloy core particle preferably, but it is not always necessary to coat the entire surface of the alloy core particle, and part of the alloy core particle may be exposed. In the alloy core particle, copper contributes to the excellent conductivity of the silver-coated alloy powder. Nickel imparts excellent solder leach resistance to the silver-coated alloy powder, and specifically, although the silver coating layer on the surface of the silver-coated alloy powder is leached by solder, it is presumed that since the alloy core particle contains nickel, the solder leach phenomenon is inhibited at the alloy core particle part.

Moreover, it is presumed that zinc enables more preferable silver coating on the alloy core particles (so that the proportion of the covered area on the surface of the metal core particle is increased), consequently imparting preferable solder wettability, and electrical conductivity may also improve in some cases. Moreover, since zinc is present in the alloy core particle, solder leach resistance may in some cases become more preferable compared to the case where copper and nickel are used for the alloy core particle. Therefore, it is presumed that if the alloy core particle is formed in the form of a ternary alloy, i.e. copper-nickel-zinc, the solder leach resistance of the alloy core particle may become more preferable in some cases.

The amount of silver coating layer (mass percentage of silver) in such silver-coated alloy powder is preferably 1 to 40 mass %, more preferably 15 to 30 mass % from the viewpoint of preferable electrical conductivity and solder wettability. From the viewpoint of production cost, etc., of silver-coated alloy powder, the content of silver is preferably 2 to 12 mass %. For the alloy core particle, in a total 100 mass % of copper, nickel, and zinc, a proportion of copper is preferably 40 to 95 mass %, more preferably 65 to 90 mass % from the viewpoint of preferable electrical conductivity. In the total 100 mass %, a proportion of nickel is preferably 4 to 40 mass %, more preferably 8 to 30 mass % from the viewpoint of preferable solder leach resistance. In the total 100 mass %, a proportion of zinc is preferably 1 to 30 mass %, more preferably 5 to 20 mass % from the view point of preferable solder wettability and solder leach resistance.

The shape of the silver-coated alloy powder is not particularly limited and may be spherical, substantially spherical, granular, flaky, or amorphous. Flaky silver-coated alloy powder can be produced by appropriately adjusting the production conditions of the powder, and can also be produced by mechanically and plastically deforming spherical silver-coated alloy powder with a ball mill or the like to flatten the same. According to the study conducted by the inventors of the present invention, observed was a tendency of the solder leach resistance being excellent in the case of a spherical or substantially spherical shape.

From the viewpoint of electrical conductivity and enabling formation of a thin external electrode, a volume-based cumulative 50% particle diameter ($D_{50}$) of the silver-coated alloy powder as measured by a laser diffraction particle size distribution measurement apparatus is preferably 0.1 to 10 μm, more preferably 1 to 9 μm, particularly preferably 2 to 6.5 μm.

The specific surface area of the silver-coated alloy powder as measured by the single point BET method is preferably 0.08 to 1.0 $m^2/g$, more preferably 0.08 to 0.50 $m^2/g$, particularly preferably 0.08 to 0.30 $m^2/g$ from the viewpoint of exhibiting preferable electrical conductivity.

A TAP density of the silver-coated alloy powder is preferably 3.0 to 7.5 $g/cm^3$, more preferably 4.6 to 6.5 $g/cm^3$ from the viewpoint of increasing powder filing density to exhibit preferable electrical conductivity.

The alloy core particle in the silver-coated alloy powder may contain trace amounts of inevitable impurities due to factors such as the raw materials for production thereof or equipment and materials used in the production process, and examples thereof include iron, sodium, potassium, calcium, palladium, magnesium, oxygen, carbon, nitrogen, phosphorus, silicon, and chlorine.

Among these, it is presumed that oxygen has negative influence on the electrical conductivity of silver-coated alloy powder. In this regard, oxygen content in the silver-coated alloy powder is preferably 0.05 to 0.60 mass %, more preferably 0.05 to 0.45 mass %.

Moreover, carbon becomes a generation source of gas such as carbon dioxide during (thermal) curing and adhesion between the external electrode and the layer in contact with it may deteriorate, thus the amount of carbon in the silver-coated alloy powder is preferably small; specifically, the amount is preferably 0.5 mass % or less, more preferably 0.35 mass % or less.

The silver-coated alloy powder according to the present invention may be subjected to surface treatment so that a TAP density is increased by improving dispersibility in an electrically conductive paste (described later) so as to increase the electrical conductivity of the external electrode while also imparting oxidation resistance thereto, and thus decrease a change over time of electrical conductivity. Examples of the surface treatment agent include a saturated or unsaturated fatty acid having 1 to 32 carbon atoms, a saturated or unsaturated amine having 1 to 32 carbon atoms, and a heterocyclic compound having 5 to 12 ring-constituting atoms. The fatty acid and the amine may have a cyclic structure, and the heterocyclic compound may be saturated or unsaturated, and may be a compound having a condensed ring structure. From the viewpoint of electrical conductivity, a saturated or unsaturated fatty acid having 1 to 32 carbon atoms is preferable as the surface treatment agent. From the viewpoint of dispersibility, the carbon number of the fatty acid and amine described above is preferably 4 to 24. As the heterocyclic compound, a triazole compound (a compound having a triazole structure in the molecule) is preferable.

Examples of the saturated or unsaturated fatty acid that can be used include butyric acid, valeric acid, caproic acid, enanthic acid, caprylic acid, pelargonic acid, cabric acid, lauric acid, myristic acid, pentadecylic acid, palmitic acid, palmitoleic acid, margaric acid, stearic acid, oleic acid, vaccenic acid, linoleic acid, linolenic acid, arachidic acid, eicosadienoic acid, eicosatrienoic acid, eicosatetraenoic acid, arachidonic acid, behenic acid, lignoceric acid, nervonic acid, cerotic acid, montanic acid, melissic acid, and the like, and it is preferable to use palmitic acid, stearic acid, or oleic acid. An example of the triazole compound is benzotriazole.

The amount of the surface treatment agent to be added, with respect to the silver-coated alloy powder (having undergone no surface treatment), is preferably 0.1 to 7 mass %, more preferably 0.3 to 6 mass %, most preferably 0.3 to 5 mass %.

Silver-coated alloy powder that has been subjected to surface treatment with such a surface treatment agent using a prescribed method described later and crushing under predetermined conditions and that has a surface treatment layer constituted by the surface treatment agent (an external electrode formed from an electrically conductive paste containing such powder) is particularly excellent in bonding strength with respect to solder, and a value obtained by dividing a ratio of the TAP density to a true density of the powder by ($D_{50}$) (TAP density/(true density×$D_{50}$)) is 0.223 or more. The true density is calculated by multiplying the densities of the main constituent metal atoms (Ag, Cu, Ni, Zn) of the silver-coated alloy powder by the corresponding proportions thereof (proportion of each of Ag, Cu, Ni, Zn based on 100 mass % as the total of Ag, Cu, Ni, Zn) and adding up the same.

By dividing the TAP density by the true density, it is possible to determine how close it is to the density in the bulk state (degree of filling) when the powder is filled in. As described above, $D_{50}$ of the silver-coated alloy powder according to the present invention is preferably 0.1 to 10 µm. In such a fine-particle region, an increase in particle diameter tends to result in an increase in TAP density. Accordingly, in order to cancel out the effect of the TAP density rising due to the particle diameter, it was decided to divide the same by $D_{50}$.

From the viewpoint of bonding strength with respect to solder, the above value (TAP density/(true density×$D_{50}$)) of the silver-coated alloy powder according to the present invention is preferably 0.225 to 0.300.

For the silver-coated alloy powder having such a predetermined surface treatment layer, surface treatment has been performed preferably, and when energy-dispersive X-ray spectroscopy (EDS) is performed on any 20 particles constituting the silver-coated alloy powder for C element and Ag element, given that for each of EDS spectra obtained for the 20 particles for the C element and the Ag element, an integrated value of the spectrum of the C element is $I_c$ and an integrated value of the spectrum of the Ag element is $I_{Ag}$, a standard deviation of a ratio of $I_c$ to $I_{Ag}$ ($I_c/I_{Ag}$) is in a range of 0.010 to 0.040. Detailed conditions for the EDS analysis are described in the examples.

Since the surface treatment agent constituting the surface treatment layer generally has carbon atoms, the aforementioned ratio ($I_c/I_{Ag}$) can be regarded as an index of the ratio of the surface treatment layer to the silver coating layer. When the standard deviation of the ratio is within a small range as described above, it is presumed that the ratio of the surface treatment layer to the silver coating layer does not largely vary depending on the particles, and the surface treatment layer is uniformly formed. As can be seen from the examples described later, silver-coated alloy powder having a standard deviation of the above ratio ($I_c/I_{Ag}$) within the above range demonstrates a preferable bonding strength with respect to solder. From the viewpoint of this bonding strength, the standard deviation of the ratio ($I_c/I_{Ag}$) is preferably 0.010 to 0.030.

Next, the L * value of the silver-coated alloy powder according to the present invention can serve as a measure for the uniformity of the silver coating, and is preferably close to the L * value of silver powder having the same particle size distribution. Specifically, the L * value of the silver-coated alloy powder is preferably 45 to 81.6, more preferably 63 to 81.6.

[Method of Producing Silver-Coated Alloy Powder]

Next, a method of producing silver-coated alloy powder according to the present invention will be described.

<Method of Producing Alloy Core Particle> (Step of Producing Alloy Core Particle).

A method of producing an alloy core particle will be described first. In the present invention, the alloy core particles are preferably produced by a water atomizing method. Alloy core particles can be produced by allowing a molten metal in which copper, nickel, and zinc have been dissolved to drop from a tundish and rapidly cooling and solidifying the molten metal by blowing thereto high pressure water under a predetermined water pressure.

The temperature of the molten metal is preferably 1000° C. to 1700° C., more preferably 1200° C. to 1700° C. When the temperature of the molten metal is high, alloy core particles with a small particle diameter tend to be obtained. By coating silver onto such particles, silver-coated alloy powder with a small particle diameter can be produced.

The water atomization can be carried out in the atmosphere or in a non-oxidizing atmosphere of argon, nitrogen, carbon monoxide, hydrogen, and the like. It is presumed that when water atomization is performed in a non-oxidizing atmosphere, oxidation of copper, which is susceptible to oxidation, can be prevented. In addition, the molten metal may also be prepared in the atmosphere or in a non-oxidizing atmosphere. Further, in order to reduce the oxygen content in the alloy core particles, a reducing agent such as carbon black or charcoal may be added to the molten metal.

The water pressure of the high pressure water used for water atomization is preferably 30 to 200 MPa; when the water pressure is high, alloy core particles with a small particle diameter can be obtained. As the high pressure water, pure water, weak acidic water (about pH 5.0 to 6.5), and alkaline water (about pH 8 to 12) can be used.

The proportions of copper, nickel, and zinc in the alloy core particle can be adjusted by adjusting the charging amount of each constituent metal in the molten metal at the time of producing the alloy core particle from the molten metal by the water atomizing method. The boiling point of zinc is as low as no higher than 1000° C., and a certain amount of zinc evaporates when alloy core particles are produced from the molten metal by the water atomization method, so it is preferable to determine the amount of zinc to be charged while paying attention to the portion that will evaporate.

Slurry in which the alloy core is dispersed in water can be obtained by allowing molten metal to drop and rapidly cooling and solidifying the molten metal by blowing high pressure water thereto, and by subjecting this to solid-liquid separation and drying the obtained solid matter, alloy core particles can be obtained. Note that according to need, the solid matter obtained by solid-liquid separation may be washed with water before it is dried, or it may be crushed after being dried, and the particle size may be adjusted by classification.

<Silver Coating> (Silver Coating Step)

A coating layer containing silver (silver coating layer) is formed on the surface of an alloy core particle produced as described above, for example. As a method of forming this coating layer, a substitution method utilizing substitution reaction of silver and a constituent metal of an alloy core particle, or a method of precipitating silver or a silver compound on the surface of the alloy core particle by a reduction method using a reducing agent can be used. In the substitution method, for example, a method of precipitating silver or a silver compound on the surface of the alloy core particle by stirring a solution containing alloy core particles and silver or a silver compound in a solvent can be employed. Further, a method of precipitating silver or a silver compound on the surface of the alloy core particle by mixing and stirring a solution containing, in a solvent, alloy core particles and an organic substance and a solution containing, in a solvent, silver or a silver compound and an organic substance can be employed.

As a solvent used for the substitution method or the reduction method, water, an organic solvent, or a solvent in which these are mixed can be used. In a case where a solvent in which water and an organic solvent are mixed is used, it is necessary to use an organic solvent which becomes liquid at room temperature (20° C. to 30° C.), and the mixing proportion of water and the organic solvent can be appropriately adjusted depending on the organic solvent used. Water used as a solvent may be distilled water, ion-exchanged water, industrial water, etc. as far as there is no risk of contamination by impurities.

Since silver ions need to be present in the solution as a raw material of the silver coating layer (coating layer made of silver or a silver compound), it is preferable to use silver nitrate having high solubility in water and a variety of organic solvents. Moreover, in order to make the silver coating reaction as uniform as possible, it is preferable to use not a solid silver nitrate but a silver nitrate solution in which silver nitrate is dissolved in a solvent (water, an organic solvent, or a solvent in which these are mixed). The amount of the silver nitrate solution to be used, the concentration of silver nitrate in the silver nitrate solution, and the amount of the organic solvent can be determined according to the amount of the silver coating layer desired.

In order to form the silver coating layer more uniformly, a chelating agent may be added to the solution. As the chelating agent, it is preferable to use a chelating agent having a high complex stability constant with respect to copper ion or the like so that copper ion or the like by-produced by the substitution reaction of the silver ion and the alloy core particle is not reprecipitated. In particular, since the alloy core particle of the silver-coated alloy powder contains copper as a main constituent, it is preferable to select a chelating agent with consideration to the complex stability constant with respect to copper. Specifically, as the chelating agent, a chelating agent selected from the group consisting of ethylenediaminetetraacetic acid (EDTA), iminodiacetic acid, diethylenetriamine, triethylenediamine, and salts thereof can be used.

In order to carry out the silver coating reaction stably and safely, a pH buffering agent may be added to the solution. As this pH buffering agent, ammonium carbonate, ammonium hydrogen carbonate, ammonia water, sodium hydrogen carbonate, and the like can be used.

In the silver coating reaction, it is preferable that before adding the silver salt, alloy core particles are introduced in the solution and the mixture is stirred so that the alloy core particles are sufficiently dispersed in the solution, and in this state, the solution containing the silver salt is added. The reaction temperature in this silver coating reaction may be any temperature at which the reaction liquid does not solidify or evaporate, and is set in the range of preferably 15° C. to 80° C., more preferably 20° C. to 75° C., most preferably 25° C. to 70° C. While the reaction time varies depending on the coating amount of silver or a silver compound or the reaction temperature, it can be set within the range of 1 minute to 5 hours.

<Surface Treatment with Surface Treatment Agent> (Surface Treatment Step)

The silver-coated alloy powder according to the present invention may be subjected to surface treatment in order to, for example, improve the electrical conductivity of the external electrode, as described above. The surface treatment can be performed in the following manner: the alloy powder coated with the silver-containing layer and the surface treatment agent are mixed in a state where liquid is substantially absent (in a case where the surface treatment agent itself is a liquid, substantially no liquid other than the surface treatment agent is present) (dry surface treatment); or a surface treatment agent is added to a slurry of alloy powder coated with a silver-containing layer and the resultant is mixed (wet surface treatment). In the wet surface treatment, the alloy powder coated with the silver-containing layer is dispersed in a liquid medium to form a slurry, and the slurry is stirred. The liquid medium is not particularly limited as far as it can dissolve the surface treatment agent, and examples thereof include water and organic solvents such as alcohol solvent, ketone solvent, ether solvent, and ester solvent. The stirring time of the slurry can be appropriately adjusted and may be, for example, 15 minutes to 1 hour. Accordingly, surface treatment is performed, and filtration and drying operations are performed to recover silver-coated alloy powder having a surface treatment layer.

Here, the inventors of the present invention discovered that by performing this surface treatment in a wet method and subjecting the obtained silver-coated alloy powder to crushing under predetermined conditions in a crushing process, which will be described below, silver-coated alloy powder can be obtained with which an external electrode having particularly excellent bonding strength with respect of solder can be formed.

<Crushing of Silver-Coated Alloy Powder> (Crushing Step)

In a case where the silver-coated alloy powder is agglomerated, crushing may be carried out to crush this agglomeration. At this time, by carrying out the above-mentioned surface treatment process in a wet method and also performing strong crushing, silver-coated alloy powder can be obtained with which an external electrode having excellent bonding strength with respect to solder can be formed. In the case of performing the surface treatment in the case of performing crushing of the silver-coated alloy powder, the crushing may be performed before the surface treatment step, may be performed after the surface treatment step, or may be performed during the surface treatment step, i.e., together with the surface treatment. On the presumption that there may be cases where the silver-coated alloy powder may agglomerate slightly due to the surface treatment, the crushing is preferably performed after the surface treatment step.

The strong crushing specifically means that the silver-coated alloy powder is subjected to crushing under a condition in which crushing is performed at a peripheral speed of 30 m/s or more and a product of the peripheral speed (m/s) and a crushing time (second) is 2000 m or more. The peripheral speed can be calculated by "circumference ratio× stem diameter (mm)×rotation speed (rpm) 60000". The crushing time is the time during which the stem is rotated and the crushing is performed. From the viewpoint of obtaining silver-coated alloy powder with which an external electrode having excellent bonding strength with respect to solder can be formed, the peripheral speed is preferably 30 to 80 m/s and the product of the peripheral speed and the crushing time is preferably 2500 to 10000 m.

[Electrically Conductive Paste]

An electrically conductive paste containing the silver-coated alloy powder according to the present invention will be described. The electrically conductive paste contains curable resin in addition to the silver-coated alloy powder. Since an electrically conductive film formed by curing (the curable resin in) the electrically conductive paste is excellent in solder wettability and solder leach resistance, and is also excellent in electrical conductivity (further, in a preferable mode, it can be used to form an external electrode which has particularly excellent bonding strength with respect to solder), the electrically conductive film is suitable as a material for forming an external electrode.

In the electrically conductive paste according to the present invention, two or more different kinds of silver-coated alloy powders corresponding to the silver-coated alloy powder according to the present invention but differing in particle diameter, shape, and the like, may be used in combination. Content of the silver-coated alloy powder in the electrically conductive paste is preferably 50 to 98 mass %, more preferably 70 to 97 mass % from the viewpoint of obtaining an external electrode having appropriate solder wettability, solder leach resistance, and electrical conductivity.

The curable resin used for the electrically conductive paste includes thermosetting resin and photocurable resin. Examples of the thermosetting resin include phenol resins, urea resins, melamine resins, epoxy resins, unsaturated polyester resins, silicone resins, polyurethane resins, polyvinyl butyral resins, polyimide resins, maleimide resins, diallyl phthalate resins, oxetane resins, and (meth)acrylic resins. The photocurable resin may be a resin having one or more unsaturated bonds causing a crosslinking reaction due to light in one molecule, and specific examples thereof include (meth)acrylic resins, maleic acid resins, maleic anhydride resins, polybutadiene resins, unsaturated polyester resins, polyurethane resins, epoxy resins, oxetane resins, phenol resins, polyimide resins, polyamide resins, alkyd resins, amino resins, polylactic acid resins, oxazoline resins, benzoxazine resins, silicone resins, and fluororesins.

These curable resins may be used singly or in combination of two or more. The percentage of the curable resin included in the electrically conductive paste is preferably 1 to 40 mass %, more preferably 3 to 30 mass % from the viewpoint of adequate curing for the formation of the external electrode and, together therewith, appropriate exhibition of solder wettability, solder leach resistance, and electrical conductivity.

To the electrically conductive paste according to the present invention, metal powder other than the silver-coated alloy powder according to the present invention may be added, such as copper powder, silver powder, aluminum powder, nickel powder, zinc powder, tin powder, bismuth powder, phosphor powder, and the like, in accordance with required properties and to an extent such that the effect of the present invention is not impaired. Content of such metal powder in the electrically conductive paste is preferably 1 to 48 mass %. The powders may be used singly or in combination of two or more.

Total content of the silver-coated alloy powder and the metal powder in the electrically conductive paste according to the present invention is preferably 50 to 98 mass %, more preferably 70 to 97 mass % from the viewpoint of exhibiting appropriate solder wettability, solder leach resistance, and electrical conductivity.

To the electrically conductive paste according to the present invention, when the paste is cured by heating, a thermal polymerization initiator may be added in order to cure the same or accelerate curing of the same. Examples of the thermal polymerization initiator include hydroperoxide, dialkyl peroxide, peroxyester, diacyl peroxide, peroxycarbonate, peroxyketal, and ketone peroxide. These thermal polymerization initiators may be used singly or in combination of two or more.

Moreover, in order to promote curing, a curing agent such as polyamine, acid anhydride, a boron trihalide compound, an amine complex salt of a boron trihalide compound, an imidazole compound, an aromatic diamine compound, a carboxylic acid compound, and the like, may be added. These may be used singly or in combination of two or more.

In the case of photopolymerizing the electrically conductive paste according to the present invention, a photopolymerization initiator is included in the electrically conductive paste. As the photopolymerization initiator, a photo radical generator or a photo cationic polymerization initiator is usually used. These photopolymerization initiators may be used singly or two or more thereof may be used together.

As the photo radical generator, compounds known in the art, which are known to be usable for this application, can be used. For example, it is possible to use benzophenone, benzoin methyl ether, benzoin propyl ether, diethoxyacetophenone, 1-hydroxycyclohexyl phenyl ketone, 2,6-dimethylbenzoyl diphenylphosphine oxide, 2,4,6-trimethylbenzoyl diphenyl phosphine oxide, or the like.

The photo cationic polymerization initiator is a compound that initiates cationic polymerization by irradiation with radiation such as electron beams or ultraviolet rays, and examples thereof include aromatic sulfonium salts, aromatic iodonium salts, aromatic diazonium salts, and aromatic ammonium salts.

Furthermore, apart from the photo cationic polymerization initiator, a curing agent for curing the polymerizable monomer may be added to the electrically conductive paste. As the curing agent, for example, amine compounds, compounds such as polyaminoamide compounds synthesized from amine compounds, tertiary amine compounds, imidazole compounds, hydrazide compounds, melamine compounds, acid anhydrides, phenol compounds, thermally latent cationic polymerization catalyst, dicyanamide, and derivatives thereof may be given as examples.

A photosensitizer can also be added to the electrically conductive paste. Specific examples of the photosensitizer include pyrene, perylene, acridine orange, thioxanthone, 2-chlorothioxanthone, and benzoflavin.

Further, to the electrically conductive paste according to the present invention, thermoplastic resins such as ethylcellulose, ethylhydroxyethylcellulose, rosin, phenoxy resin, and polyacetal resin can be added, according to need. These thermoplastic resins may be used singly or in combination of two or more.

To the electrically conductive paste according to the present invention, additives such as a surfactant, a dispersant, a stabilizer, a plasticizer, and a metal oxide powder may be added, in case of necessity.

Although a method of preparing the electrically conductive paste described above is not particularly limited, the preparation may include the following: For example, each constituent element is weighed and placed in a predetermined container and pre-kneaded using a mixing and deaeration machine, a mortar machine, a universal stirrer, a kneader, or the like, and then the mixture is subjected to main kneading with a three-roll mill. Further, according to need, organic solvents (for example, texanol (2,2,4-trimethyl-1,3-pentanediol 2-methylpropanoate), terpineol, carbitol acetate (diethylene glycol monoethyl ether acetate), ethylene glycol, dibutyl acetate, or diethylene glycol monobutyl ether acetate) may be added to adjust the viscosity.

The viscosity at 25° C. of the electrically conductive paste according to the present invention, as measured by an E type viscometer, is preferably 80 to 200 Pa·s from the viewpoint of printability of the electrically conductive paste and the like.

[Electronic Part]

Next, described will be an electronic part that can be produced using the electrically conductive paste according to the present invention. There are no particular limitations regarding the electronic part as far as the electronic part has an external electrode and can be connected with other electric elements using solder. Specific examples thereof include a capacitor, an inductor, a laminated wiring board, a piezoelectric element, a varistor, a thermistor, and a resistor. Semiconductor chips may also be cited as an example.

The electrically conductive paste according to the present invention is applied on a member constituting the electronic part at a location at which the external electrode should be formed, and forms the external electrode by being processed under a condition in which the curable resin cures. The electrically conductive paste is applied by dipping or screen printing, transfer printing or other such printing methods. When the electronic part is, for example, a capacitor, the member constituting the electronic part has a constitution of a stack in which a dielectric layer and an internal electrode layer having a different pole are stacked alternately, and the external electrode is formed at both end portions of the stack at which internal electrode layers are drawn out alternately.

Regarding the electrically conductive paste having been applied, in a case where the paste is to be thermally cured, heating is carried out at a temperature that is preferably 100° C. to 300° C., more preferably 120° C. to 250° C., yet more preferably 150° C. to 220° C., and for a duration of preferably 10 to 120 minutes, more preferably 15 to 90 minutes, yet more preferably 20 to 60 minutes.

In a case where the electrically conductive paste is to be photocured, the amount of radiation radiated for curing is arbitrary as far as the amount falls within a range that allows the photopolymerization initiator to produce radicals, and in accordance with the composition of the curable resin and the type and amount of photopolymerization initiator, ultraviolet rays with a wavelength of 200 to 450 nm are radiated within the range of preferably 0.1 to 200 J/cm$^2$. The radiation may be radiated over a plurality of times dividedly. Specific examples of the light source lamp to be used include a metal halide lamp, a high pressure mercury lamp, and an ultraviolet LED lamp. Note that for the purpose of completing the polymerization quickly, photopolymerization and thermal polymerization, such as those described above, may be carried out simultaneously.

When the curable resin in the electrically conductive paste is cured through the thermal curing and photocuring described above, the resin forms a cured product and the constituents of silver-coated alloy powder contained therein come into mutual contact due to curing shrinkage of the resin and electrical conduction is established, resulting in the formation of the external electrode. In a case where a volatile substance such as an organic solvent is contained in the electrically conductive paste, at least a portion of the same is volatilized during curing reaction. An electronic part including an external electrode is obtained in the aforementioned way.

In the formed external electrode, a proportion of the silver-coated powder based on the total of the silver-coated alloy powder and (the cured product of) the curable resin is substantially the same as the proportion thereof in the electrically conductive paste, and is preferably 60 to 99 mass %, more preferably 70 to 97 mass %. Likewise, in the external electrode, the proportion of (the cured product of) the curable resin based on the aforementioned total is preferably 1 to 40 mass %, more preferably 3 to 30 mass %.

It is presumed that a large amount of silver-coated alloy powder is present on the surface of the external electrode, which is to come into contact with solder. In this silver-coated alloy powder, it is presumed that silver coating is considered to be performed preferably, thus the external electrode is excellent in solder wettability. Furthermore, since the alloy core particle inside the silver coating layer is excellent in solder leach resistance, even if the silver coating layer on the surface is leached due to the solder leach phenomenon, it is presumed that it will be inhibited to a certain extent at the alloy core particle part, so the external electrode is excellent in solder leach resistance. Furthermore, the external electrode is also excellent in electrical conductivity due to the silver coating layer and the presence of copper in the alloy core particle. Furthermore, in a preferable mode of the present invention, the external electrode is particularly excellent in bonding strength with respect to the external electrode.

[Electric Device]

Since the external electrode of the electronic part according to the present invention is excellent in solder wettability, solder leach resistance, and electrical conductivity as described above, the external electrode can be connected preferably to other electric elements through solder joint. The electric device according to the present invention has a constitution including a substrate, an electric element formed on the substrate, an electronic part mounted on the substrate, and a solder member connecting the electronic part and the electric element, and may also include other members or elements according to need. Examples of the electric element include wiring, a lead, a terminal, an electric circuit, and an electrode.

The electric element may be formed on the substrate directly or, for the purpose of enhancing adhesion between the electric element and the substrate, for example, may be formed on the substrate via an intermediate layer interposed therebetween. Usually, the electronic part is mounted on the substrate by being connected to the electric element using a solder member.

The substrate is not particularly limited, and is preferably a paper phenol substrate, a paper epoxy substrate, a glass epoxy substrate, a polymer film, a glass substrate, or a ceramic substrate (including a low-temperature calcinated ceramic substrate).

The material of the solder member is not particularly limited, but for example, the solder member contains at least one metal selected from the group consisting of tin, lead, silver, copper, zinc, bismuth, indium, and aluminum. In recent years, lead-free solder is desired from the viewpoint of environmental burden, so it is preferable that the solder member contain substantially no lead. Examples of the lead-free solder member include Sn/Ag/Cu solder, Sn/Zn/Bi solder, Sn/Cu solder, Sn/Ag/In/Bi solder, and Sn/Zn/Al solder.

The solder paste containing such solder is printed on the electric element, for example, and the electronic part is disposed on the printed solder paste (the electric element and the electronic part may be subjected to defluxing according to need, or flux may be included in the solder paste). Then, a reflow process is carried out to perform heating at a temperature of about 200° C. to 350° C. to melt the solder, and thus the electric element and (the external electrode of) the electronic part are connected electrically and physically. The electric device according to the present invention is produced in this way and, according to need, other members or elements are formed or mounted on the substrate. Note that in this case, an external electrode of the electronic part and the solder member adhere to each other, and bonding strength of the external electrode and the solder member is preferably $3.0 \times 10^4$ Pa to $20.0 \times 10^4$ Pa, more preferably $7.0 \times 10^4$ Pa to $19.0 \times 10^4$ Pa, yet more preferably $9.0 \times 10^4$ Pa to $18.0 \times 10^4$ Pa.

EXAMPLES

The present invention will be described in more detail below with reference to examples and comparative examples, but the present invention is not limited by the examples and the comparative examples.

Production Example 1

<Production of Powder of Alloy Core Particle>

In the atmosphere, molten metal made up of 32 kg of copper, 4 kg of nickel, and 4 kg of zinc heated to 1200° C. was allowed to drop from the lower part of a tundish while high-pressure water (water pressure: 75 MPa, water flow rate: 160 L/min, pH: 5.8)) was sprayed thereto in the atmosphere by a water atomizing device to rapidly cool and solidify the same, and the obtained alloy powder was filtered, washed with water, dried, and crushed to obtain alloy powder (copper-nickel-zinc alloy powder).

<Silver Coating Reaction>

The following were prepared: A solution (solution 1) obtained by dissolving 3.2 kg of EDTA-2Na dihydrate and 3.2 kg of ammonium carbonate in 37.7 kg of pure water; and a solution (solution 2) obtained by adding a solution obtained by dissolving 1.2 kg of silver nitrate in 3.7 kg of pure water to a solution obtained by dissolving 7.1 kg of EDTA-2Na dihydrate and 3.6 kg of ammonium carbonate in 28.4 kg of pure water.

Next, under a nitrogen atmosphere, 6.8 kg of the obtained alloy powder was added as core particle powder to be coated (hereinafter also referred to as "core powder") to the solution 1, and while the obtained mixture was stirred, the temperature was raised to 35° C. The solution 2 was added to the solution in which the alloy powder was dispersed, and the resultant was stirred for 1 hour, filtered, washed with water, and dried to obtain alloy powder coated with silver.

Next, 80 g of the obtained silver-coated alloy powder and 0.24 g of palmitic acid (0.3 mass % with respect to the silver-coated alloy powder) were placed in a coffee mill (stem diameter: 60 mm) and the resultant was crushed at a rotation speed of about 14000 rpm (peripheral speed: about 44 m/s) for 20 seconds (this also serving to mix the silver-coated alloy powder and palmitic acid) and this was performed twice (the product of peripheral speed (44 m/s) and the crushing time (40 seconds) was 1760 m), whereby substantially spherical silver-coated alloy powder 1 surface treated with palmitic acid was obtained.

Production Example 2

In the atmosphere, molten metal made up of 32 kg of copper, 4 kg of nickel, and 4 kg of zinc heated to 1200° C. was allowed to drop from the lower part of a tundish while high-pressure water (water pressure: 71 MPa, water flow rate: 160 L/min, pH: 5.8)) was sprayed thereto in the atmosphere by a water atomizing device to rapidly cool and solidify the same, and the obtained alloy powder was filtered, washed with water, dried, and crushed to obtain alloy powder (copper-nickel-zinc alloy powder).

The following were prepared: A solution (solution 1) obtained by dissolving 2.4 kg of EDTA-2Na dihydrate and 2.4 kg of ammonium carbonate in 27.7 kg of pure water; and a solution (solution 2) obtained by adding a solution obtained by dissolving 2 kg of silver nitrate in 6.1 kg of pure water to a solution obtained by dissolving 11.8 kg of EDTA-2Na dihydrate and 5.9 kg of ammonium carbonate in 47.1 kg of pure water.

Next, under a nitrogen atmosphere, 5 kg of the obtained alloy powder was added as core powder to be coated to the solution 1, and while the obtained mixture was stirred, the temperature was raised to 45° C. The solution 2 was added to the solution in which the alloy powder was dispersed, and the resultant was stirred for 1 hour, filtered, washed with water, and dried to obtain alloy powder coated with silver. 80 g of this silver-coated alloy powder was taken out and surface treatment was carried out with palmitic acid as in Production Example 1 to obtain substantially spherical silver-coated alloy powder 2.

Production Example 3

In the atmosphere, molten metal made up of 7.5 kg of copper, 1.5 kg of nickel, and 1 kg of zinc heated to 1200° C. was allowed to drop from the lower part of a tundish while high-pressure water (water pressure: 70 MPa, water flow rate: 160 L/min, pH: 5.8)) was sprayed thereto in the atmosphere by a water atomizing device to rapidly cool and solidify the same, and the obtained alloy powder was filtered, washed with water, dried, and crushed to obtain alloy powder (copper-nickel-zinc alloy powder).

The following were prepared: A solution (solution 1) obtained by dissolving 0.12 kg of EDTA-2Na dihydrate and 0.12 kg of ammonium carbonate in 1.4 kg of pure water; and a solution (solution 2) obtained by adding a solution obtained by dissolving 0.04 kg of silver nitrate in 0.14 kg of pure water to a solution obtained by dissolving 0.26 kg of EDTA-2Na dihydrate and 0.13 kg of ammonium carbonate in 1 kg of pure water.

Next, under a nitrogen atmosphere, 0.25 kg of the obtained alloy powder was added as core powder to be coated to the solution 1, and while the obtained mixture was stirred, the temperature was raised to 35° C. The solution 2 was added to the solution in which the alloy powder was dispersed, and the resultant was stirred for 1 hour, filtered, washed with water, and dried to obtain alloy powder coated with silver. 80 g of this silver-coated alloy powder was taken out and surface treatment was carried out with palmitic acid as in Production Example 1 to obtain substantially spherical silver-coated alloy powder 3.

Production Example 4

In the atmosphere, molten metal made up of 6.5 kg of copper, 2.5 kg of nickel, and 1 kg of zinc heated to 1300° C. was allowed to drop from the lower part of a tundish while high-pressure water (water pressure: 70 MPa, water flow rate: 160 L/min, pH: 5.8)) was sprayed thereto in the atmosphere by a water atomizing device to rapidly cool and solidify the same, and the obtained alloy powder was filtered, washed with water, dried, and crushed to obtain alloy powder (copper-nickel-zinc alloy powder).

The following were prepared: A solution (solution 1) obtained by dissolving 0.15 kg of EDTA-2Na dihydrate and 0.15 kg of ammonium carbonate in 1.8 kg of pure water; and a solution (solution 2) obtained by adding a solution obtained by dissolving 0.06 kg of silver nitrate in 0.17 kg of pure water to a solution obtained by dissolving 0.33 kg of EDTA-2Na dihydrate and 0.17 kg of ammonium carbonate in 1.3 kg of pure water.

Next, under a nitrogen atmosphere, 0.32 kg of the obtained alloy powder was added as core powder to be coated to the solution 1, and while the obtained mixture was stirred, the temperature was raised to 25° C. The solution 2 was added to the solution in which the alloy powder was dispersed, and the resultant was stirred for 1 hour, filtered, washed with water, and dried to obtain alloy powder coated with silver. 80 g of this silver-coated alloy powder was taken out and surface treatment was carried out with palmitic acid as in Production Example 1 to obtain substantially spherical silver-coated alloy powder 4.

Production Example 5

In the atmosphere, molten metal made up of 16 kg of copper, 2 kg of nickel, and 2 kg of zinc heated to 1300° C. was allowed to drop from the lower part of a tundish while high-pressure water (water pressure: 150 MPa, water flow rate: 160 L/min, pH: 5.8)) was sprayed thereto in the atmosphere by a water atomizing device to rapidly cool and solidify the same, and the obtained alloy powder was filtered, washed with water, dried, and crushed to obtain alloy powder (copper-nickel-zinc alloy powder).

The following were prepared: A solution (solution 1) obtained by dissolving 2.2 kg of EDTA-2Na dihydrate and 2.2 kg of ammonium carbonate in 25.7 kg of pure water; and a solution (solution 2) obtained by adding a solution obtained by dissolving 0.8 kg of silver nitrate in 2.5 kg of pure water to a solution obtained by dissolving 4.9 kg of EDTA-2Na dihydrate and 2.4 kg of ammonium carbonate in 19.4 kg of pure water.

Next, under a nitrogen atmosphere, 4.6 kg of the obtained alloy powder was added as core powder to be coated to the solution 1, and while the obtained mixture was stirred, the temperature was raised to 35° C. The solution 2 was added to the solution in which the alloy powder was dispersed, and the resultant was stirred for 1 hour, filtered, washed with water, and dried to obtain alloy powder coated with silver. 80 g of this silver-coated alloy powder was taken out and surface treatment was carried out with palmitic acid as in Production Example 1 to obtain substantially spherical silver-coated alloy powder 5.

Production Example 6

In the atmosphere, molten metal made up of 16 kg of copper, 2 kg of nickel, and 2 kg of zinc heated to 1200° C. was allowed to drop from the lower part of a tundish while high-pressure water (water pressure: 60 MPa, water flow rate: 140 L/min, pH: 5.8)) was sprayed thereto in the atmosphere by a water atomizing device to rapidly cool and solidify the same, and the obtained alloy powder was filtered, washed with water, dried, and crushed to obtain alloy powder (copper-nickel-zinc alloy powder).

The following were prepared: A solution (solution 1) obtained by dissolving 0.1 kg of EDTA-2Na dihydrate and 0.1 kg of ammonium carbonate in 1.1 kg of pure water; and a solution (solution 2) obtained by adding a solution obtained by dissolving 0.02 kg of silver nitrate in 0.05 kg of pure water to a solution obtained by dissolving 0.1 kg of EDTA-2Na dihydrate and 0.05 kg of ammonium carbonate in 0.4 kg of pure water.

Next, under a nitrogen atmosphere, 0.2 kg of the obtained alloy powder was added as core powder to be coated to the solution 1, and while the obtained mixture was stirred, the temperature was raised to 35° C. The solution 2 was added to the solution in which the alloy powder was dispersed, and the resultant was stirred for 1 hour, filtered, washed with water, and dried to obtain alloy powder coated with silver. 80 g of this silver-coated alloy powder was taken out and surface treatment was carried out with palmitic acid as in Production Example 1 to obtain substantially spherical silver-coated alloy powder 6.

Production Example 7

In the atmosphere, molten metal made up of 32 kg of copper, 4 kg of nickel, and 4 kg of zinc heated to 1200° C. was allowed to drop from the lower part of a tundish while high-pressure water (water pressure: 75 MPa, water flow rate: 160 L/min, pH: 5.8)) was sprayed thereto in the atmosphere by a water atomizing device to rapidly cool and solidify the same, and the obtained alloy powder was filtered, washed with water, dried, and crushed to obtain alloy powder (copper-nickel-zinc alloy powder).

The obtained alloy powder, a stainless steel ball with a diameter of 1.6 mm, and an industrial alcohol (Solmix AP 7 manufactured by Japan Alcohol Trading CO., LTD.) were placed in a wet-type media stirring mill (bar shaped arm-type stirring blade) and the slurry obtained after the stirring was filtered and dried to obtain flaky alloy powder.

The following were prepared: A solution (solution 1) obtained by dissolving 0.26 kg of EDTA-2Na dihydrate and 0.26 kg of ammonium carbonate in 3.1 kg of pure water; and a solution (solution 2) obtained by adding a solution obtained by dissolving 0.2 kg of silver nitrate in 0.67 kg of pure water to a solution obtained by dissolving 1.3 kg of EDTA-2Na dihydrate and 0.65 kg of ammonium carbonate in 5.2 kg of pure water.

Next, under a nitrogen atmosphere, 550 g of the obtained flaky alloy powder was added as core powder to be coated to the solution 1, and while the obtained mixture was stirred, the temperature was raised to 35° C. The solution 2 was added to the solution in which the flaky alloy powder was dispersed and the mixture was stirred for 1 hour. Then, a solution obtained by dissolving 1.7 g of palmitic acid in 53.4 g of industrial alcohol as a dispersant (Solmix AP 7 manufactured by Japan Alcohol Trading CO., LTD.) was added, and the resultant was further stirred for 40 minutes, filtered, washed with water and dried to obtain flaky silver-coated alloy powder 7.

Comparative Production Example 1

In the atmosphere, molten metal made up of 7 kg silver heated to 1400° C. was allowed to drop from the lower part of a tundish while high-pressure water (water pressure: 76 MPa, water flow rate: 160 L/min, pH: 10.3)) was sprayed thereto in the atmosphere by a water atomizing device to rapidly cool and solidify the same, and the obtained powder of silver was filtered, washed with water, dried, and crushed to obtain silver powder.

Next, 80 g of the obtained silver powder and 0.24 g of palmitic acid (0.3 mass % with respect to the silver powder) were placed in an equivalent coffee mill to that in Production Example 1 and the resultant was crushed twice at about 14000 rpm for 20 seconds, whereby substantially spherical silver powder surface-treated with palmitic acid was obtained.

Comparative Production Example 2

In the atmosphere, molten metal made up of 15 kg copper heated to 1300° C. was allowed to drop from the lower part of a tundish while high-pressure water (water pressure: 65 MPa, water flow rate: 160 L/min, pH: 10)) was sprayed thereto in the atmosphere by a water atomizing device to rapidly cool and solidify the same, and the obtained alloy powder was filtered, washed with water, dried, and crushed to obtain copper powder.

The following were prepared: A solution (solution 1) obtained by dissolving 0.3 kg of EDTA-2Na dihydrate and 0.3 kg of ammonium carbonate in 3.9 kg of pure water; and a solution (solution 2) obtained by adding a solution obtained by dissolving 0.12 kg of silver nitrate in 0.37 kg of pure water to a solution obtained by dissolving 0.7 kg of EDTA-2Na dihydrate and 0.36 kg of ammonium carbonate in 2.9 kg of pure water.

Next, under a nitrogen atmosphere, 0.7 kg of the obtained copper powder was added as core powder to be coated to the solution 1, and while the obtained mixture was stirred, the temperature was raised to 25° C. The solution 2 was added to the solution in which the copper powder was dispersed and the mixture was stirred for 1 hour. Then, a solution obtained by dissolving 2.1 g of palmitic acid in 67.9 g of industrial alcohol as a dispersant (Solmix AP 7 manufactured by Japan Alcohol Trading CO., LTD.) was added, and the resultant was further stirred for 40 minutes, filtered, washed with water and dried to obtain substantially spherical, silver-coated copper powder.

Comparative Production Example 3

In the atmosphere, molten metal made up of 15 kg nickel heated to 1600° C. was allowed to drop from the lower part of a tundish while high-pressure water (water pressure: 150 MPa, water flow rate: 160 L/min, pH: 5.8)) was sprayed thereto in the atmosphere by a water atomizing device to rapidly cool and solidify the same, and the obtained alloy powder was filtered, washed with water, dried, and crushed to obtain nickel powder.

The following were prepared: A solution (solution 1) obtained by dissolving 0.17 kg of EDTA-2Na dihydrate and 0.17 kg of ammonium carbonate in 1.9 kg of pure water; and a solution (solution 2) obtained by adding a solution obtained by dissolving 0.06 kg of silver nitrate in 0.19 kg of pure water to a solution obtained by dissolving 0.37 kg of EDTA-2Na dihydrate and 0.18 kg of ammonium carbonate in 1.5 kg of pure water.

Next, under a nitrogen atmosphere, 0.35 kg of the obtained nickel powder was added as core powder to be coated to the solution 1, and while the obtained mixture was stirred, the temperature was raised to 70° C. The solution 2 was added to the solution in which the nickel powder was dispersed, and the resultant was stirred for 1 hour, filtered, washed with water, and dried to obtain substantially spherical silver-coated nickel powder coated with silver. 80 g of this silver-coated nickel powder was taken out and surface treatment was carried out with palmitic acid as in Comparative Production Example 1 to obtain substantially spherical silver-coated nickel powder.

Comparative Production Example 4

In the atmosphere, molten metal made up of 18 kg of copper and 2 kg of nickel heated to 1450° C. was allowed to drop from the lower part of a tundish while high-pressure water (water pressure: 80 MPa, water flow rate: 160 L/min, pH: 5.8) was sprayed thereto in the atmosphere by a water atomizing device to rapidly cool and solidify the same, and the obtained alloy powder was filtered, washed with water, dried, and crushed to obtain copper-nickel alloy powder 1.

The following were prepared: A solution (solution 1) obtained by dissolving 0.3 kg of EDTA-2Na dihydrate and 0.3 kg of ammonium carbonate in 3.6 kg of pure water; and a solution (solution 2) obtained by adding a solution obtained by dissolving 0.11 kg of silver nitrate in 0.35 kg of pure water to a solution obtained by dissolving 0.38 kg of EDTA-2Na dihydrate and 0.34 kg of ammonium carbonate in 2.7 kg of pure water.

Next, under a nitrogen atmosphere, 0.65 kg of the obtained alloy powder was added as core powder to be coated to the solution 1, and while the obtained mixture was stirred, the temperature was raised to 35° C. The solution 2 was added to the solution in which the alloy powder was dispersed, and the resultant was stirred for 1 hour, filtered, washed with water, and dried to obtain substantially spherical silver-coated copper-nickel alloy powder coated with silver. 80 g of this silver-coated copper-nickel alloy powder was taken out and surface treatment was carried out with palmitic acid as in Comparative Production Example 1 to obtain substantially spherical silver-coated copper-nickel alloy powder 1.

Comparative Production Example 5

In the atmosphere, molten metal made up of 8.5 kg of copper and 1.5 kg of nickel heated to 1300° C. was allowed to drop from the lower part of a tundish while high-pressure water (water pressure: 70 MPa, water flow rate: 160 L/min, pH: 5.8) was sprayed thereto in the atmosphere by a water atomizing device to rapidly cool and solidify the same, and the obtained alloy powder was filtered, washed with water, dried, and crushed to obtain substantially spherical copper-nickel alloy powder 2.

The following were prepared: A solution (solution 1) obtained by dissolving 0.15 kg of EDTA-2Na dihydrate and 0.15 kg of ammonium carbonate in 1.8 kg of pure water; and a solution (solution 2) obtained by adding a solution obtained by dissolving 0.06 kg of silver nitrate in 0.17 kg of pure water to a solution obtained by dissolving 0.34 kg of EDTA-2Na dihydrate and 0.17 kg of ammonium carbonate in 1.4 kg of pure water.

Next, under a nitrogen atmosphere, 0.32 kg of the obtained alloy powder was added as core powder to be coated to the solution 1, and while the obtained mixture was stirred, the temperature was raised to 25° C. The solution 2 was added to the solution in which the alloy powder was dispersed, and the resultant was stirred for 1 hour, filtered, washed with water, and dried to obtain substantially spherical silver-coated copper-nickel alloy powder coated with silver. 80 g of this silver-coated copper-nickel alloy powder was taken out and surface treatment was carried out with palmitic acid as in Comparative Production Example 1 to obtain substantially spherical silver-coated copper-nickel alloy powder 2.

Comparative Production Example 6

In the atmosphere, molten metal made up of 38 kg of copper and 2 kg of zinc heated to 1200° C. was allowed to drop from the lower part of a tundish while high-pressure water (water pressure: 70 MPa, water flow rate: 160 L/min, pH: 5.8) was sprayed thereto in the atmosphere by a water atomizing device to rapidly cool and solidify the same, and the obtained alloy powder was filtered, washed with water, dried, and crushed to obtain substantially spherical copper-zinc alloy powder.

The following were prepared: A solution (solution 1) obtained by dissolving 0.25 kg of EDTA-2Na dihydrate and 0.25 kg of ammonium carbonate in 2.94 kg of pure water; and a solution (solution 2) obtained by adding a solution obtained by dissolving 0.20 kg of silver nitrate in 0.61 kg of pure water to a solution obtained by dissolving 1.18 kg of EDTA-2Na dihydrate and 0.59 kg of ammonium carbonate in 4.68 kg of pure water.

Next, under a nitrogen atmosphere, 0.53 kg of the obtained alloy powder was added as core powder to be coated to the solution 1, and while the obtained mixture was stirred, the temperature was raised to 25° C. The solution 2 was added to the solution in which the copper powder was dispersed and the mixture was stirred for 1 hour. Then, a solution obtained by dissolving 1.6 g of palmitic acid in 51.4 g of industrial alcohol as a dispersant (Solmix AP 7 manufactured by Japan Alcohol Trading CO., LTD.) was added, and the resultant was further stirred for 40 minutes, filtered, washed with water and dried to obtain substantially spherical copper-zinc alloy powder coated with silver.

[Property Evaluation]

For each of the metal powders obtained in Production Examples 1 to 7 and Comparative Production Examples 1 to 6, the mass percentage of silver in the entire metal powder, the mass percentage of each metal element to the total of copper, nickel, and zinc in the metal powder, the BET specific surface area, TAP density, oxygen content, carbon content, particle size distribution, color difference, and thermogravimetric increase rate, and impurity element amount were determined. More specifically, measurement of each property was carried out as follows.

Mass percentage of silver: determined by dissolving metal powder with nitric acid, followed by addition of hydrochloric acid thereto, drying the precipitate of the produced silver chloride (AgCl), and weighing the same.

Mass percentage of each metal element to the total of copper, nickel, and zinc: determined in the following way. Metal powder (about 2.5 g) was spread in a vinyl chloride ring (inner diameter 3.2 cm×thickness 4 mm) and then pressed with a tablet briquette press machine (model number BRE-50 manufactured by Maekawa Testing Machine MFG Co., LTD.) to apply a load of 100 kN to produce a metal powder pellet; the pellet was placed in a sample holder (opening diameter 3.0 cm) and set at a measurement position in a fluorescent X-ray analyzer (RIX 2000, manufactured by Rigaku Corporation); the measurement atmosphere was set under reduced pressure (8.0 Pa); X-ray output was set to 50 kV, 50 mA; measurement was carried out under this condition; and software attached to the analyzer was used to automatically calculate the mass percentage from the results of the measurement.

BET specific surface area: measured using a BET specific surface area measuring instrument (4-Sorb US manufactured by Yuasa Ionics Co., Ltd.) by flowing nitrogen gas into a measuring apparatus at 105° C. for 20 minutes for degassing; then while flowing a mixed gas of nitrogen and helium (N2: 30% by volume, He: 70% by volume), measurement was carried out using the single point BET method.

TAP density: similarly to the method described in Japanese Patent Application Publication No. 2007-263860, metal powder was filled into a bottomed cylindrical die (up to 80% of the volume thereof) having an inner diameter of 6 mm and a height of 11.9 mm to form a metal powder layer; pressure of 0.160 N/m$^2$ was uniformly applied to the upper surface of the metal powder layer and the metal powder layer was compressed to the maximum density extent to which the metal powder could be filled densely at this pressure; thereafter, the height of the metal powder layer was measured and the density of the metal powder was obtained from the measured value of the height of the metal powder layer and the weight of the filled metal powder; and this was taken as the TAP density of the metal powder.

Oxygen content: measured using an oxygen/nitrogen analyzer (EMGA-920 manufactured by HORIBA, LTD.).

Carbon content: measured using a carbon/sulfur analyzer (EMIA-220V manufactured by HORIBA, LTD.).

Particle size distribution: measured at a dispersion pressure of 5 bar using a laser diffraction particle size distribution measurement apparatus (HELOS particle size distribution measurement apparatus (HELOS & RODOS) (air flow type dry dispersing unit) manufactured by Sympatec GmbH).

Color difference: measured by weighting 5 g of metal powder as a measurement sample and placing the same in a round cell having a diameter of 30 mm; tapping the same 10 times to flatten the surface; and subjecting the same to measurement in SCE mode by a color difference meter (Spectro Color Meter SQ 2000 manufactured by NIPPON DENSHOKU INDUSTRIES Co., LTD.).

Thermogravimetric increase rate (300° C. TG): measured using a simultaneous thermogravimetric analyzer (EX-TERTG/DTA 6300 model by SII NanoTechnology Inc.) as follows. Metal powder was placed in the atmosphere and heated from room temperature (25° C.) to 300° C. at the temperature increase rate of 5° C./min and weight was measured, and the difference of this weight from the weight of the metal powder before heating was obtained; from the increase rate (%) of this difference (weight increase resulting from heating) with respect to the weight of the metal powder before heating, all of the increase in weight due to heating was assumed to be an increase in weight due to oxidation of the metal powder; and thus high temperature stability of the metal powder in the atmosphere (against oxidization) was evaluated.

Impurity element amount: determined in a similar manner to the mass percentage of each metal element with respect to the total of copper, nickel, and zinc. At this time, the total of silver, copper, nickel, zinc, oxygen, carbon, calcium, palladium, iron, silicon, chlorine, phosphorus and magnesium was taken as 100 mass %.

Results of the above evaluations are shown in Tables 1 and 2 below.

TABLE 1

| | | Ag amount % | XRF composition | | | BET (m$^2$/g) | TAP (g/cm$^3$) | O (%) |
| | Shape | | Cu % | Ni % | Zn % | | | |
| --- | --- | --- | --- | --- | --- | --- | --- | --- |
| Prod. Ex. 1 | Subst. Spherical | 10.6 | 80.0 | 10.7 | 9.3 | 0.17 | 5.7 | 0.19 |
| Prod. Ex. 2 | Subst. Spherical | 22.3 | 80.0 | 10.8 | 9.2 | 0.15 | 5.1 | 0.33 |
| Prod. Ex. 3 | Subst. Spherical | 10.4 | 75.3 | 15.6 | 9.1 | 0.18 | 5.7 | 0.23 |
| Prod. Ex. 4 | Subst. Spherical | 10.3 | 65.4 | 25.8 | 8.8 | 0.19 | 5.9 | 0.3 |
| Prod. Ex. 5 | Subst. Spherical | 10.6 | 83.6 | 10.8 | 5.6 | 0.52 | 4.5 | 0.18 |

TABLE 1-continued

| | | | | | | | | |
|---|---|---|---|---|---|---|---|---|
| Prod. Ex. 6 | Subst. Spherical | 5.0 | 80.5 | 10.9 | 8.6 | 0.25 | 5.4 | 0.17 |
| Prod. Ex. 7 | Flaky | 21.3 | 80.2 | 10.8 | 9.0 | 0.23 | 5.6 | 0.39 |
| Compar. Prod. Ex. 1 | Subst. Spherical | 100 | — | — | — | 0.22 | 6.9 | 0.08 |
| Compar. Prod. Ex. 2 | Subst. Spherical | 10.3 | 100 | 0 | 0 | 0.17 | 6.1 | 0.12 |
| Compar. Prod. Ex. 3 | Subst. Spherical | 10.1 | 0.2 | 99.8 | 0.0 | 0.40 | 5.4 | 0.55 |
| Compar. Prod. Ex. 4 | Subst. Spherical | 10.5 | 88.4 | 11.6 | 0.0 | 0.26 | 6.1 | 0.59 |
| Compar. Prod. Ex. 5 | Subst. Spherical | 10.3 | 84.3 | 15.7 | 0.0 | 0.23 | 5.7 | 0.54 |
| Compar. Prod. Ex. 6 | Subst. Spherical | 20.0 | 95.9 | 0.0 | 4.1 | 0.24 | 5.8 | 0.16 |

| | | Particle size distribution (dry method) | | | | Color difference | | |
|---|---|---|---|---|---|---|---|---|
| | O/BET | C (%) | D10 (μm) | D50 (μm) | D90 (μm) | TG 300° C. % | L* | a* | b* |
| Prod. Ex. 1 | 1.12 | 0.21 | 2.7 | 5.2 | 8.5 | 0.77 | 74.7 | 1.5 | 8.6 |
| Prod. Ex. 2 | 2.20 | 0.22 | 3.3 | 6.1 | 9.5 | 0.73 | 73.1 | 0.8 | 6.8 |
| Prod. Ex. 3 | 1.28 | 0.23 | 2.5 | 5.5 | 10.1 | 0.73 | 74.1 | 0.2 | 10.8 |
| Prod. Ex. 4 | 1.58 | 0.28 | 2.3 | 5.2 | 9.5 | 0.55 | 71.2 | 0.5 | 9.6 |
| Prod. Ex. 5 | 0.34 | 0.23 | 1.1 | 2.6 | 4.3 | 0.97 | 64.5 | 2.1 | 10.4 |
| Prod. Ex. 6 | 0.66 | 0.21 | 2.4 | 5.1 | 8.9 | 0.53 | 67.8 | 1.9 | 13.9 |
| Prod. Ex. 7 | 1.69 | 0.21 | 2.7 | 6.0 | 12.5 | 0.78 | 72.4 | 1.4 | 9.9 |
| Compar. Prod. Ex. 1 | 0.36 | 0.20 | 1.9 | 4.9 | 9.9 | −0.12 | 81.7 | −0.6 | 6.6 |
| Compar. Prod. Ex. 2 | 0.71 | 0.15 | 2.0 | 5.0 | 9.1 | 1.46 | 79.9 | 1.7 | 8.5 |
| Compar. Prod. Ex. 3 | 1.38 | 0.21 | 1.2 | 3.2 | 7.9 | 0.06 | 53.5 | 0.4 | 5.6 |
| Compar. Prod. Ex. 4 | 2.27 | 0.22 | 1.8 | 4.6 | 11.6 | 0.54 | 60.1 | 2.0 | 10.5 |
| Compar. Prod. Ex. 5 | 2.35 | 0.23 | 2.2 | 5.1 | 9.7 | 0.52 | 60.8 | 1.2 | 9.3 |
| Compar. Prod. Ex. 6 | 0.68 | 0.16 | 2.7 | 5.5 | 9.7 | 1.32 | 76.8 | 0.3 | 6.5 |

Prod. Ex. . . . Production Example
Compar. Prod. Ex. . . . Comparative Production Example
Subst. Spherical . . . Substantially Spherical

TABLE 2

| | Ca | Pd | Fe | Si | Cl | P | Mg |
|---|---|---|---|---|---|---|---|
| Production Example 1 | 0.0666 | 0.0302 | 0.0154 | 0 | 0 | 0 | 0 |
| Production Example 2 | 0.0813 | 0.054 | 0.0179 | 0 | 0 | 0 | 0 |
| Production Example 3 | 0 | 0 | 0 | 0.18 | 0 | 0 | 0 |
| Production Example 4 | 0 | 0 | 0.0201 | 0.182 | 0 | 0 | 0 |
| Production Example 5 | 0 | 0 | 0 | 0.197 | 0 | 0 | 0 |
| Production Example 6 | 0 | 0 | 0.0149 | 0.178 | 0 | 0 | 0 |
| Production Example 7 | 0 | 0 | 0 | 0.166 | 0 | 0 | 0 |
| Compar. Prod. Ex. 1 | 0 | 0 | 0 | 0.113 | 0.224 | 0 | 0 |
| Compar. Prod. Ex. 2 | 0.0727 | 0.0304 | 0 | 0 | 0 | 0 | 0 |
| Compar. Prod. Ex. 3 | 0 | 0.0398 | 0.0214 | 0.0079 | 0 | 0.0224 | 0 |
| Compar. Prod. Ex. 4 | 0 | 0 | 0.0186 | 0.192 | 0.644 | 0 | 0 |
| Compar. Prod. Ex. 5 | 0 | 0 | 0.0161 | 0.178 | 0 | 0 | 0 |
| Compar. Prod. Ex. 6 | 0 | 0 | 0 | 0 | 0 | 0.0362 | 0 |

Compar. Prod. Ex. . . . Comparative Production Example

Figure 14:
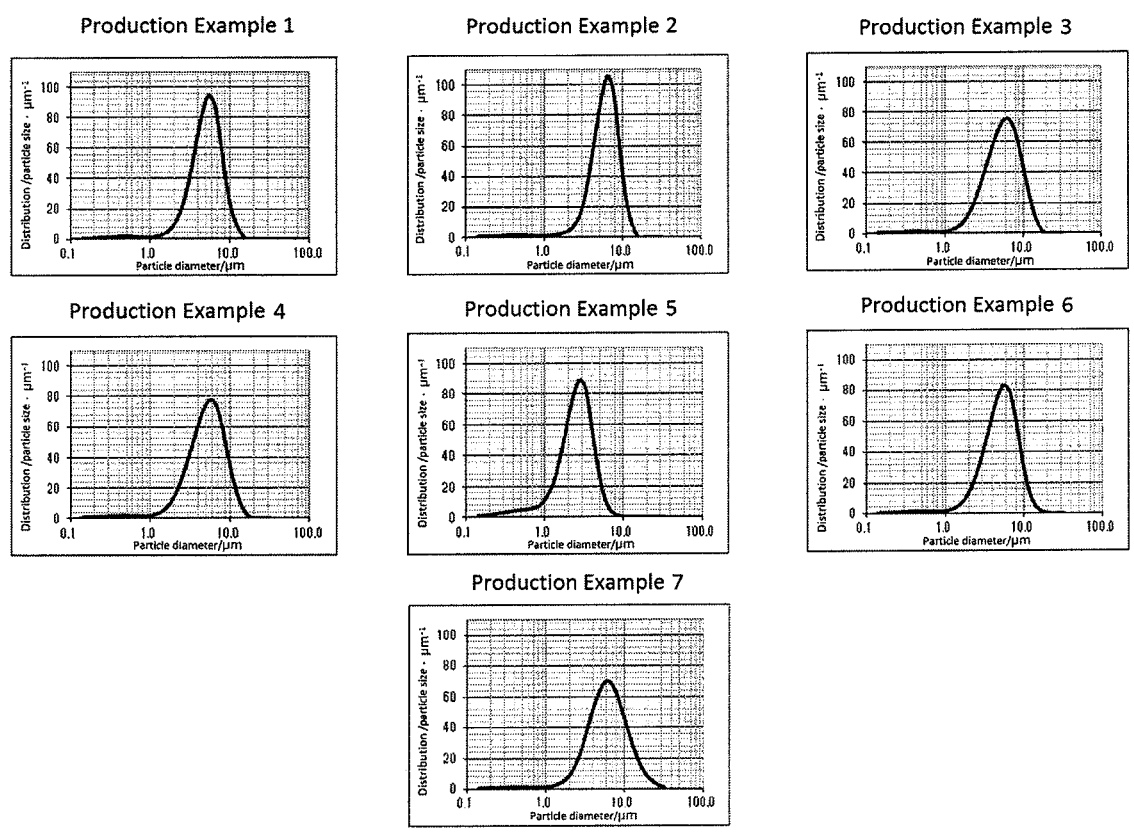
FIG. 14 shows particle size distribution measurement results of the silver-coated alloy powders obtained in Production Examples 1 to 7.
Figure 15:
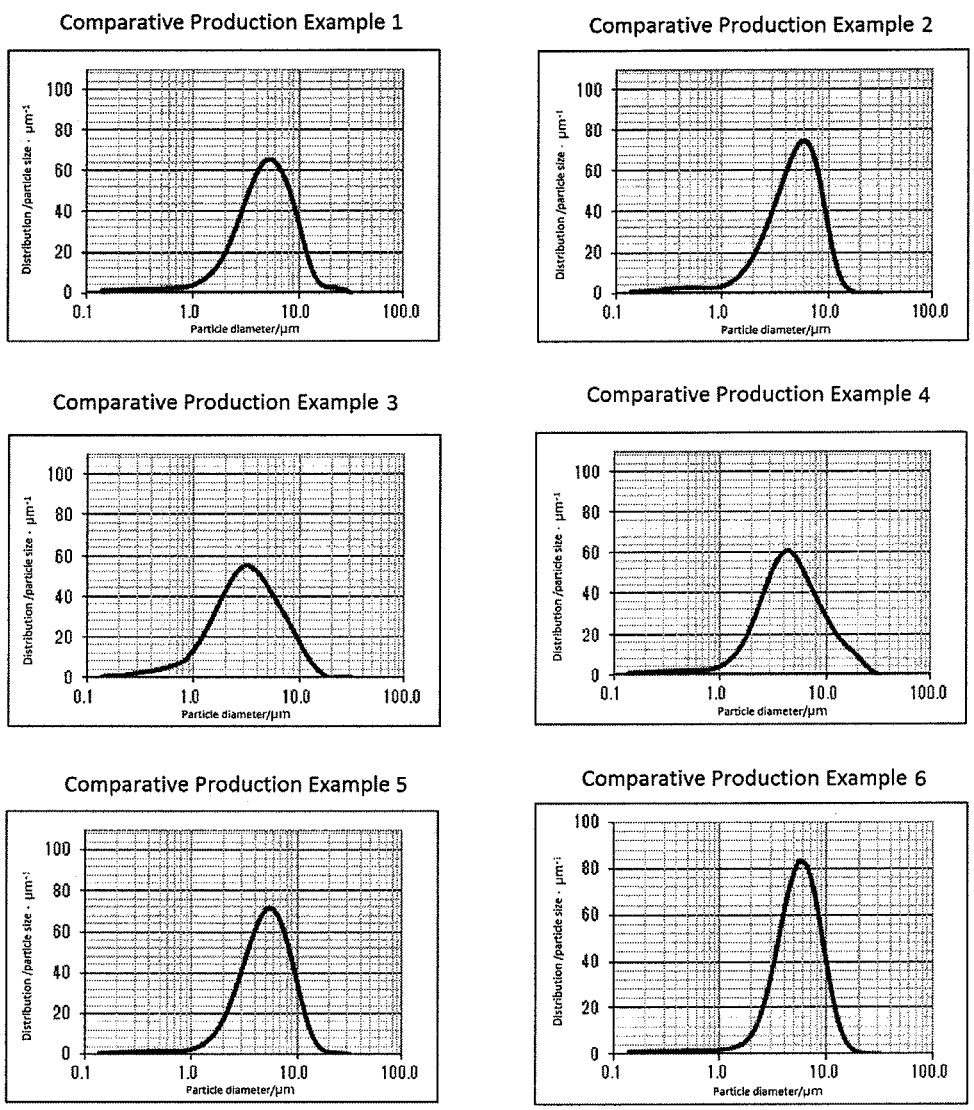
FIG. 15 shows particle size distribution measurement results of the metal powders obtained in Comparative Production Examples 1 to 6.

SEM observation images of the metal powders obtained in Production Examples 1 to 7 and Comparative Production Examples 1 to 6 are shown in FIGS. 1 to 13, the particle size distributions of the silver-coated alloy powders of Production Examples 1 to 7 are shown in FIG. 14, and the particle size distribution of the metal powders of Comparative Production Examples 1 to 6 is shown in FIG. 15.

[Resistance Evaluation]
<Preparation of Electrically Conductive Pastes of Examples 1 to 7 and Comparative Examples 1 to 6>

9.3 g of each metal powder obtained in Production Examples 1 to 7 and Comparative Production Examples 1 to 6 and 0.82 g of a bisphenol F type epoxy resin (Adekaresin EP-4901 E manufactured by ADEKA CORPORATION) as a thermosetting resin, 0.041 g of boron trifluoride monoethylamine as a curing agent, 0.25 g of diethylene glycol monobutyl ether acetate as a solvent, and 0.01 g of oleic acid as a dispersing agent were mixed in a kneading and defoaming machine; then the mixture was passed through a three-roll mill five times to disperse the same evenly; diethylene glycol monobutyl ether acetate was added to and mixed with the obtained kneaded product; and viscosity of the resultant at 25° C. was adjusted to about 100 Pa·s, whereby the electrically conductive pastes of Examples 1 to 7 and Comparative Examples 1 to 6 were obtained.

<Resistance Evaluation>

After printing this electrically conductive paste on an alumina substrate by a screen printing method (in a pattern with a line width of 500 μm and a line length of 37.5 mm), the same was cured by heating at 200° C. for 40 minutes in the atmosphere, whereby an electrically conductive film (film thickness: about 20 μm) was formed, and the volume resistivity (initial resistance) of the obtained electrically conductive film was calculated.

[Evaluation of Solder Wettability and Solder Leach Resistance]

For a 2 mm-square electrically conductive film (separately formed by screen printing at the time of resistance evaluation) (thickness; 25 to 30 μm) on the alumina substrate formed from the electrically conductive paste of Examples 1 to 7 and Comparative Examples 1 to 6 obtained as described above, solder wettability and solder leach resistance were evaluated as follows.

<Solder Wettability>

After immersing the electrically conductive film formed on the alumina substrate described above in ESR-250 T 4 (Flux manufactured by Senju Metal Industry Co., Ltd.), the same was immersed in a lead-free solder at 260° C. (ECO SOLDER M 705 (Sn 96.5 Ag 3 Cu 0.5 Solder, manufactured by Senju Metal Industry Co., Ltd.) for 1 second, then the alumina substrate was pulled up to perform the soldering. Then, the surface shape of the solder on the 2 mm square electrically conductive film was measured with a laser type microscope VK-9710 (manufactured by KEYENCE CORPORATION). Using the obtained height data, the uneven part was measured using the attached software, and a portion at and above a height threshold of 40 μm from the substrate was assumed to be constituted by adhering solder, and the proportion of the area thereof was determined.

<Solder Leach Resistance>

In the same manner as in the evaluation of the solder wettability, except that it was immersed in a lead-free solder bath for 10 seconds, the proportion of the area of the adhering solder was obtained.

<Result>

The results of the above evaluation of solder wettability and solder leach resistance are shown in Table 3 below together with the results of the above resistance evaluation.

TABLE 3

| | Initial resistance | Solder evaluation (area %) | |
|---|---|---|---|
| | (μΩ · cm) | Wetting | Leach |
| Example 1 | 300 | 96 | 80 |
| Example 2 | 190 | 92 | 72 |
| Example 3 | 590 | 78 | 75 |
| Example 4 | 530 | 97 | 79 |
| Example 5 | 240 | 84 | 63 |
| Example 6 | 1100 | 83 | 62 |
| Example 7 | 300 | 86 | 43 |
| Compar. Ex. 1 | 69 | 85 | 8 |
| Compar. Ex. 2 | 37 | 73 | 36 |
| Compar. Ex. 3 | 2600 | 7 | 44 |
| Compar. Ex. 4 | 510 | 55 | 39 |
| Compar. Ex. 5 | 510 | 52 | 25 |
| Compar. Ex. 6 | 53 | 81 | 4 |

Compar. Ex. . . . Comparative Example

As shown in Table 3, in each of the electrically conductive pastes of Examples 1 to 7, both initial resistance and solder evaluation showed favorable numerical values. From these facts, it can be confirmed that by using each silver-coated alloy powder of Production Examples 1 to 7, and each of the electrically conductive pastes of Examples 1 to 7, the formation of an external electrode excellent in solder wettability and solder leach resistance, and also excellent in electrical conductivity can be used.

[Production Examples 8 to 11] (Study of Surface Treatment Condition and Crushing Condition)

Production Example 8

In the atmosphere, molten metal made up of 32 kg of copper, 4 kg of nickel, and 4 kg of zinc heated to 1200° C. was allowed to drop from the lower part of a tundish while high-pressure water (water pressure: 150 MPa, water flow rate: 160 L/min, pH: 5.8)) was sprayed thereto in the atmosphere by a water atomizing device to rapidly cool and solidify the same, and the obtained alloy powder was filtered, washed with water, dried, and crushed to obtain alloy powder (copper-nickel-zinc alloy powder).

The following were prepared: A solution (solution 1) obtained by dissolving 0.12 kg of EDTA-2Na dihydrate and 0.12 kg of ammonium carbonate in 1.39 kg of pure water; and a solution (solution 2) obtained by adding a solution obtained by dissolving 0.09 kg of silver nitrate in 0.29 kg of pure water to a solution obtained by dissolving 0.55 kg of EDTA-2Na dihydrate and 0.28 kg of ammonium carbonate in 2.21 kg of pure water.

Next, under a nitrogen atmosphere, 0.25 kg of the obtained alloy powder was added as core powder to be coated to the solution 1, and while the obtained mixture was stirred, the temperature was raised to 35° C. The solution 2 was added to the solution in which the alloy powder was dispersed, and the resultant was stirred for 1 hour, filtered, washed with water, and dried to obtain substantially spherical silver-coated nickel powder coated with silver.

Next, 80 g of the obtained silver-coated alloy powder and 0.24 g of palmitic acid (0.3 mass % with respect to the silver-coated alloy powder) were placed in an equivalent coffee mill to that in Production Example 1 and the resultant was crushed twice at about 14000 rpm for 20 seconds (the product of the peripheral speed and the crushing time was 1760 m), whereby substantially spherical silver-coated alloy powder 8 surface-treated with palmitic acid was obtained.

Production Example 9

In the same way as Production Example 8, except that the crushing condition was changed to 4 times of 20 seconds of crushing (the product of the peripheral speed and the crushing time was 3520 m), substantially spherical silver-coated alloy powder 9 surface-treated with palmitic acid was obtained.

Production Example 10

In the same way as Production Example 8, alloy powder (copper-nickel-zinc alloy powder) was obtained. The following were prepared: A solution (solution 1) obtained by dissolving 0.24 kg of EDTA-2Na dihydrate and 0.24 kg of ammonium carbonate in 2.77 kg of pure water; and a solution (solution 2) obtained by adding a solution obtained by dissolving 0.18 kg of silver nitrate in 0.57 kg of pure water to a solution obtained by dissolving 1.11 kg of EDTA-2Na dihydrate and 0.55 kg of ammonium carbonate in 4.41 kg of pure water.

Next, under a nitrogen atmosphere, 0.50 kg of the obtained alloy powder was added as core powder to be coated to the solution 1, and while the obtained mixture was stirred, the temperature was raised to 25° C. The solution 2 was added to the solution in which the alloy powder was dispersed and the mixture was stirred for 1 hour. Then, a solution obtained by dissolving 1.5 g of palmitic acid in 48.5 g of industrial alcohol as a dispersant (Solmix AP 7 manufactured by Japan Alcohol Trading CO., LTD.) was added, and the resultant was further stirred for 40 minutes, filtered, washed with water and dried to obtain silver-coated alloy powder surface-treated with palmitic acid.

This silver-coated alloy powder was subjected twice to crushing of 20 seconds at about 14000 rpm (the product of the peripheral speed and the crushing time was 1760 m), whereby substantially spherical silver-coated alloy powder 10 surface-treated with palmitic acid was obtained.

Production Example 11

In the same way as Production Example 10, except that the crushing condition was changed to 4 times of 20 seconds of crushing (the product of the peripheral speed and the crushing time was 3520 m), substantially spherical silver-coated alloy powder 11 surface-treated with palmitic acid was obtained.

[Property Evaluation]

For silver-coated alloy powder obtained in Production Examples 8 to 11, the mass percentage of silver in the entire silver-coated alloy powder, the mass percentage of each metal element to the total of copper, nickel, and zinc in the silver-coated alloy powder, the BET specific surface area, TAP density, oxygen content, carbon content, particle size distribution, color difference, and thermogravimetric increase rate were determined in a similar way to the above. Results are shown in Table 4 below.

<Evaluation of Bonding Strength>

Two sheets of mending tape (manufactured by 3M Japan Co., Ltd.) were placed on an Al sintered film on an alumina substrate (4 parts alumina substrate 2-4-06, thickness: 0.65 mm, manufactured by NIPPON CARBIDE INDUSTRIES CO., INC.) at an interval of 3.0 mm. The electrically conductive paste obtained as described above was placed between the tapes, and the paste was smoothed with a squeegee for a grind gauge.

Thereafter, the tape was peeled off from the alumina substrate and preliminarily dried at 80° C. for 15 minutes. Thereafter, resin curing was performed at 200° C. for 30 minutes to obtain a cured resin film having a thickness of about 20 μm.

Then, a flux (JS-EU-31, KOKI Company Ltd) was applied onto the cured resin film, and subsequently a solder ribbon having a width of 1.5 mm (Cu—O-150-1.5-B Sn/Pb, MARUSHO CO., LTD.: 40 μm) was placed thereon, and soldering was performed on the 1.5 cm-length portion of the solder ribbon using a soldering iron set to 400° C.

Thereafter, a part (1 cm) of the solder ribbon that had not been soldered was raised, and the bonding strength [N]

TABLE 4

| | | Ag amount | XRF composition | | | BET | TAP | O | | C | Particle size distribution (dry method) | | | TG | Color difference | | |
| | Shape | % | Cu % | Ni % | Zn % | (m²/g) | (g/cm³) | (%) | O/BET | (%) | D10 (μm) | D50 (μm) | D90 (μm) | 300° C. % | L* | a* | b* |
|---|---|---|---|---|---|---|---|---|---|---|---|---|---|---|---|---|---|
| Prod. Ex. 8 | Subst. Spherical | 20.7 | 80.9 | 10.7 | 8.4 | 0.44 | 4.3 | 0.24 | 0.54 | 0.21 | 1.5 | 3.3 | 5.5 | 0.75 | 70.8 | 0.7 | 10.1 |
| Prod. Ex. 9 | Subst. Spherical | 20.5 | 81.5 | 10.5 | 8.0 | 0.44 | 5.3 | 0.25 | 0.57 | 0.25 | 1.1 | 2.7 | 4.4 | 0.97 | 69.6 | 0.4 | 7.6 |
| Prod. Ex. 10 | Subst. Spherical | 20.5 | 80.9 | 10.7 | 8.4 | 0.46 | 5.2 | 0.23 | 0.50 | 0.21 | 1.1 | 2.7 | 4.7 | 0.97 | 71.4 | 1.3 | 11.5 |
| Prod. Ex. 11 | Subst. Spherical | 20.5 | 81.0 | 10.7 | 8.3 | 0.43 | 5.5 | 0.23 | 0.52 | 0.21 | 1.1 | 2.6 | 4.6 | 0.96 | 69.5 | 0.2 | 10.1 |

Prod. Ex. . . . Production Example
Subst. Spherical . . . Substantially Spherical

[Evaluation of Bonding Strength]

<Preparation of Electrically Conductive Pastes of Examples 8 to 11>

5.0 g of each of the silver-coated alloy powders obtained in Production Examples 8 to 11, 1.12 g of a mixture containing a phenoxy resin, a polyhydric alcohol glycidyl type epoxy resin and a curing agent, described in WO2016/017618 pamphlet, and 0.02 g of diethylene glycol monobutyl ether acetate were mixed in a kneading and defoaming machine, then diethylene glycol monobutyl ether acetate was added to and mixed with the resultant kneaded product, and the viscosity at 25° C. was adjusted to about 100 Pa·s, whereby the electrically conductive pastes of the Examples 8 to 11 were obtained.

between the portion of the solder ribbon having been soldered and the cured resin film was measured using a tensile compression tester (SV-55CB manufactured by IMADA-SS Corporation). Since the soldering area was 0.015 m×0.0015 m, a value obtained by dividing the measured value by $2.25 \times 10^{-5}$ (m²) was taken as bonding strength [Pa].

As a result, the bonding strength with respect to solder of the electrically conductive film (resin cured film) formed using each of the electrically conductive pastes of Examples 8 to 11 was as shown in Table 5 below. In addition, TAP density/(true density×$D_{50}$) of the silver-coated alloy powder is also shown. The values for the silver-coated alloy powders of Production Examples 1 to 7 are also shown.

TABLE 5

| | Ag amount | XRF composition | | | TAP | Particle size distribution (dry method) D50 | True density | TAP/(true density × D50) | Bonding strength measured in Example | |
| | % | Cu % | Ni % | Zn % | (g/cm³) | (μm) | g/cm³ | μm⁻¹ | N | Pa |
|---|---|---|---|---|---|---|---|---|---|---|
| Prod. Ex. 8 | 20.7 | 80.9 | 10.7 | 8.4 | 4.3 | 3.3 | 9.14 | 0.142 | 1.2 | 5.3 × 10^4 |
| Prod. Ex. 9 | 20.5 | 81.5 | 10.5 | 8.0 | 5.3 | 2.7 | 9.14 | 0.220 | 1.3 | 5.8 × 10^4 |

TABLE 5-continued

| | Ag amount | XRF composition | | | Particle size distribution (dry method) | | True density | TAP/(true density × $D_{50}$) | Bonding strength measured in Example | |
| | | Cu | Ni | Zn | TAP | D50 | | | N | Pa |
| | % | % | % | % | (g/cm³) | (μm) | g/cm³ | μm⁻¹ | | |
|---|---|---|---|---|---|---|---|---|---|---|
| Prod. Ex. 10 | 20.5 | 80.9 | 10.7 | 8.4 | 5.2 | 2.7 | 9.13 | 0.212 | 1.8 | 8.0 × 10^4 |
| Prod. Ex. 11 | 20.5 | 81.0 | 10.7 | 8.3 | 5.5 | 2.6 | 9.14 | 0.231 | 2.2 | 9.8 × 10^4 |
| Prod. Ex. 1 | 10.6 | 80.0 | 10.7 | 9.3 | 5.7 | 5.2 | 8.95 | 0.122 | — | — |
| Prod. Ex. 2 | 22.3 | 80.0 | 10.8 | 9.2 | 5.1 | 6.1 | 9.15 | 0.091 | — | — |
| Prod. Ex. 3 | 10.4 | 75.3 | 15.6 | 9.1 | 5.7 | 5.5 | 8.95 | 0.116 | — | — |
| Prod. Ex. 4 | 10.3 | 65.4 | 25.8 | 8.8 | 5.9 | 5.2 | 8.95 | 0.127 | — | — |
| Prod. Ex. 5 | 10.6 | 83.6 | 10.8 | 5.6 | 4.5 | 2.6 | 9.01 | 0.195 | — | — |
| Prod. Ex. 6 | 5.0 | 80.5 | 10.9 | 8.6 | 5.4 | 5.1 | 8.87 | 0.120 | — | — |
| Prod. Ex. 7 | 21.3 | 80.2 | 10.8 | 9.0 | 5.6 | 6.0 | 9.14 | 0.103 | — | — |

Prod. Ex. . . . Production Example

As shown in Table 5, the bonding strength in the electrically conductive paste obtained from the silver-coated alloy powder of Production Example 9 through the strong crushing showed a higher value than the electrically conductive paste obtained from the silver-coated alloy powder of Production Example 8 not having been subjected to strong crushing. Likewise, the bonding strength in the electrically conductive paste obtained from the silver-coated alloy powder of Production Example 11 through the strong crushing showed a higher value than the electrically conductive paste obtained from the silver-coated alloy powder of Production Example 10 not having been subjected to strong crushing. Comparing Production Examples 9 and 11, the electrically conductive paste obtained from the silver-coated alloy powder of Production Example 11, for which the surface treatment process was performed in a wet method and strong crushing was performed after the surface treatment, showed a higher bonding strength.

[EDS Analysis]

The silver-coated alloy powders obtained in Production Examples 9 and 11 were subjected to energy-dispersive X-ray spectroscopy (EDS) under the following condition.

That is, using S-4700 (manufactured by Hitachi Ltd.) and EX-250 (Detector X-MAX 20) (manufactured by HORIBA, LTD.), at an accelerating voltage of 20 kV, EDS element mapping measurement (line analysis) was performed on any 20 particles constituting the silver-coated alloy powder (analysis was conducted on C element and Ag element, and a powder sample was fixed with aluminum tape).

For each of EDS spectra obtained for the 20 particles for the C element and the Ag element, an integrated value of the spectrum of the C element ($I_c$) and an integrated value of the spectrum of the Ag element ($I_{Ag}$) were determined, and a ratio of $I_c$ to $I_{Ag}$ ($I_c/I_{Ag}$) was determined. Further, a mean value and a standard deviation of the ratio ($I_c/I_{Ag}$) of the 20 particles were determined. The results are shown in Table 6 and Table 7 below.

TABLE 6

| Production Example 9 | | | |
|---|---|---|---|
| | $I_{Ag}$ | $I_c$ | $I_c/I_{Ag}$ |
| Particle 1 | 24.9 | 6.7 | 0.27 |
| Particle 2 | 82.9 | 6.6 | 0.08 |
| Particle 3 | 108.3 | 5.6 | 0.05 |
| Particle 4 | 80.0 | 5.0 | 0.06 |
| Particle 5 | 105.1 | 9.5 | 0.09 |
| Particle 6 | 67.4 | 2.1 | 0.03 |
| Particle 7 | 110.8 | 6.4 | 0.06 |
| Particle 8 | 98.9 | 8.9 | 0.09 |
| Particle 9 | 118.6 | 8.0 | 0.07 |
| Particle 10 | 42.2 | 5.8 | 0.14 |
| Particle 11 | 90.8 | 5.7 | 0.06 |
| Particle 12 | 112.6 | 5.6 | 0.05 |
| Particle 13 | 73.0 | 2.7 | 0.04 |
| Particle 14 | 105.5 | 7.4 | 0.07 |
| Particle 15 | 180.3 | 15.6 | 0.09 |
| Particle 16 | 132.6 | 11.5 | 0.09 |
| Particle 17 | 119.8 | 5.6 | 0.05 |
| Particle 18 | 101.0 | 9.2 | 0.09 |
| Particle 19 | 225.4 | 4.3 | 0.02 |
| Particle 20 | 84.4 | 4.3 | 0.05 |

$I_c/I_{Ag}$ mean value: 0.077
$I_c/I_{Ag}$ standard deviation: 0.051

TABLE 7

| Production Example 11 | | | |
|---|---|---|---|
| | $I_{Ag}$ | $I_c$ | $I_c/I_{Ag}$ |
| Particle 1 | 91.7 | 6.6 | 0.07 |
| Particle 2 | 145.5 | 9.7 | 0.07 |
| Particle 3 | 145.8 | 12.6 | 0.09 |
| Particle 4 | 133.1 | 5.7 | 0.04 |
| Particle 5 | 75.2 | 6.4 | 0.08 |
| Particle 6 | 128.2 | 7.5 | 0.06 |
| Particle 7 | 107.5 | 8.4 | 0.08 |
| Particle 8 | 104.5 | 8.8 | 0.08 |
| Particle 9 | 157.2 | 7.4 | 0.05 |
| Particle 10 | 160.8 | 16.1 | 0.10 |
| Particle 11 | 121.8 | 12.1 | 0.10 |
| Particle 12 | 128.2 | 14.2 | 0.11 |
| Particle 13 | 100.9 | 7.4 | 0.07 |
| Particle 14 | 118.5 | 7.2 | 0.06 |
| Particle 15 | 135.7 | 16.5 | 0.12 |
| Particle 16 | 159.9 | 7.7 | 0.05 |
| Particle 17 | 96.2 | 8.9 | 0.09 |
| Particle 18 | 159.3 | 11.2 | 0.07 |
| Particle 19 | 118.2 | 12.2 | 0.10 |
| Particle 20 | 133.5 | 12.0 | 0.09 |

$I_c/I_{Ag}$ mean value: 0.080
$I_c/I_{Ag}$ standard deviation: 0.021

As shown in Tables 6 and 7, the standard deviation of the ratio ($I_c/I_{Ag}$) of the silver-coated alloy powder of Production Example 9 was 0.051, and the standard deviation of the ratio ($I_c/I_{Ag}$) of the silver-coated alloy powder of Production Example 11 was 0.021. Since palmitic acid, i.e. the surface treatment agent, has carbon atoms, the above results suggest that the surface treatment was performed more preferably for the silver-coated alloy powder of Production Example 11 (formation of the surface treatment layer per particle was more uniform).

The invention claimed is:

1. Silver-coated alloy powder comprising a coating layer on a surface of an alloy core particle containing copper, nickel, zinc, and inevitable impurities, the coating layer containing silver, wherein a value obtained by dividing a ratio of the TAP density to a true density of the silver-coated alloy powder by a volume-based cumulative 50% particle diameter ($D_{50}$) of the silver-coated alloy powder as measured by a laser diffraction particle size distribution measurement apparatus (TAP density/(true density×$D_{50}$)) is 0.223 or more.

2. The silver-coated alloy powder according to claim 1, wherein the volume-based cumulative 50% particle diameter ($D_{50}$) is 0.1 to 10 μm.

3. The silver-coated alloy powder according to claim 1, wherein in a total 100 mass % of copper, nickel, and zinc in the alloy core particle, a proportion of copper is 40 to 95 mass %, a proportion of nickel is 4 to 40 mass %, and a proportion of zinc is 1 to 30 mass %, and a mass percentage of silver in the silver-coated alloy powder is 1 to 40 mass %.

4. The silver-coated alloy powder according to claim 1, wherein the silver-coated alloy powder has, on a particle surface thereof, a surface treatment layer constituted by a surface treatment agent.

5. The silver-coated alloy powder according to claim 4, wherein the surface treatment agent is at least one type selected from the group consisting of a saturated or unsaturated fatty acid having 1 to 32 carbon atoms, a saturated or unsaturated amine having 1 to 32 carbon atoms, and a heterocyclic compound having 5 to 12 ring-constituting atoms.

6. The silver-coated alloy powder according to claim 4, wherein when energy-dispersive X-ray spectroscopy (EDS) is performed on any 20 particles constituting the silver-coated alloy powder for C element and Ag element, given that for each of EDS spectra obtained for the 20 particles for the C element and the Ag element, an integrated value of the spectrum of the C element is $I_c$ and an integrated value of the spectrum of the Ag element is $I_{Ag}$, a standard deviation of a ratio of $I_c$ to $I_{Ag}$ ($I_c/I_{Ag}$) is in a range of 0.010 to 0.040.

7. A method of producing silver-coated alloy powder, the method comprising:
forming a coating layer containing silver on a surface of an alloy core particle containing copper, nickel, zinc, and inevitable impurities to produce a silver-coated alloy powder;
surface treating the silver-coated alloy powder with a surface treatment agent in a wet method to produce a surface-treated silver-coated alloy powder; and
subjecting the surface-treated silver-coated alloy powder to crushing at a peripheral speed of 30 m/s or more, wherein a product of the peripheral speed (m/s) and a crushing time (second) is 2000 to 3520 m.

8. The method of producing silver-coated alloy powder according to claim 7, wherein the surface treatment agent is at least one type selected from the group consisting of a saturated or unsaturated fatty acid having 1 to 32 carbon atoms, a saturated or unsaturated amine having 1 to 32 carbon atoms, and a heterocyclic compound having 5 to 12 ring-constituting atoms.

9. An electrically conductive paste containing curable resin and the silver-coated alloy powder according to claim 1.

10. An electronic part comprising an external electrode, wherein the external electrode contains curable resin and the silver-coated alloy powder according to claim 1.

11. An electric device comprising a substrate, an electric element formed on the substrate, the electronic part according to claim 10, the electronic part being mounted on the substrate, and a solder member connecting the electronic part and the electric element.

12. The electric device according to claim 11, wherein an external electrode of the electronic part and the solder member adhere to each other, and bonding strength thereof is $3.0 \times 10^4$ Pa to $20.0 \times 10^4$ Pa.

13. Silver-coated alloy powder comprising a coating layer on a surface of an alloy core particle containing copper, nickel, zinc, and inevitable impurities, the coating layer containing silver,
wherein the silver-coated alloy powder has, on a particle surface thereof, a surface treatment layer constituted by a surface treatment agent, and
wherein when energy-dispersive X-ray spectroscopy (EDS) is performed on any 20 particles constituting the silver-coated alloy powder for C element and Ag element, given that for each of EDS spectra obtained for the 20 particles for the C element and the Ag element, an integrated value of the spectrum of the C element is $I_c$ and an integrated value of the spectrum of the Ag element is $I_{Ag}$, a standard deviation of a ratio of $I_c$ to $I_{Ag}$ ($I_c/I_{Ag}$) is in a range of 0.010 to 0.040.

14. The silver-coated alloy powder according to claim 13, wherein a volume-based cumulative 50% particle diameter (D50) of the silver-coated alloy powder as measured by a laser diffraction particle size distribution measurement apparatus is 0.1 to 10 μm.

15. The silver-coated alloy powder according to claim 13, wherein in a total 100 mass % of copper, nickel, and zinc in the alloy core particle, a proportion of copper is 40 to 95 mass %, a proportion of nickel is 4 to 40 mass %, and a proportion of zinc is 1 to 30 mass %, and
wherein a mass percentage of silver in the silver-coated alloy powder is 1 to 40 mass %.

16. The silver-coated alloy powder according to claim 13, wherein the surface treatment agent is at least one type selected from the group consisting of a saturated or unsaturated fatty acid having 1 to 32 carbon atoms, a saturated or unsaturated amine having 1 to 32 carbon atoms, and a heterocyclic compound having 5 to 12 ring-constituting atoms.

17. An electrically conductive paste containing curable resin and the silver-coated alloy powder according to claim 13.

18. An electronic part comprising an external electrode, wherein the external electrode contains curable resin and the silver-coated alloy powder according to claim 13.

19. An electric device comprising a substrate, an electric element formed on the substrate, the electronic part according to claim 18, the electronic part being mounted on the substrate, and a solder member connecting the electronic part and the electric element.

* * * * *